US012635558B2

(12) United States Patent
Sakamoto et al.

(10) Patent No.: US 12,635,558 B2
(45) Date of Patent: May 19, 2026

(54) SEMICONDUCTOR DEVICE AND MOUNTING SUBSTRATE

(71) Applicant: Nuvoton Technology Corporation Japan, Kyoto (JP)

(72) Inventors: Mitsuaki Sakamoto, Kyoto (JP); Masao Hamasaki, Osaka (JP); Ryouichi Ajimoto, Kyoto (JP); Hiroshi Yoshida, Toyama (JP); Takashi Yui, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 19/224,299

(22) Filed: May 30, 2025

(65) Prior Publication Data

US 2025/0293109 A1 Sep. 18, 2025

Related U.S. Application Data

(60) Division of application No. 19/075,303, filed on Mar. 10, 2025, now Pat. No. 12,575,444, which is a
(Continued)

(51) Int. Cl.
*H10W 74/10* (2026.01)
*H10D 30/66* (2025.01)
(Continued)

(52) U.S. Cl.
CPC ........ *H10W 74/137* (2026.01); *H10D 30/668* (2025.01); *H10D 64/252* (2025.01); *H10D 64/513* (2025.01); *H10D 64/519* (2025.01)

(58) Field of Classification Search
CPC ............ H01L 24/06; H01L 2224/0603; H10D 30/668; H10D 64/252; H10D 64/519; H10D 62/127
See application file for complete search history.

(56) References Cited

U.S. PATENT DOCUMENTS 8,907,407 B2 12/2014 Oikawa
2004/0067606 A1* 4/2004 Fehr .................... H01L 25/0657
438/109
(Continued)

FOREIGN PATENT DOCUMENTS

JP 2010-097999 A 4/2010
JP 2014-132636 A 7/2014
(Continued)

OTHER PUBLICATIONS

International Search Report issued on Nov. 28, 2023 in International (PCT) Application No. PCT/JP2023/033097, with English translation.
(Continued)

*Primary Examiner* — Samuel A Gebremariam
*Assistant Examiner* — Jonas T Beardsley
(74) *Attorney, Agent, or Firm* — Rimon P.C.

(57) ABSTRACT

A semiconductor device includes: a semiconductor layer; a vertical metal-oxide semiconductor (MOS) transistor; a protective film; a first wiring electrode connected to a source electrode of the vertical MOS transistor; and a second wiring electrode connected to a gate electrode of the vertical MOS transistor. A first perimeter structure is provided in a perimeter portion of the first wiring electrode in the plan view of the semiconductor layer, the first perimeter structure protruding upward of the semiconductor device and including the source electrode, the protective film, and the first wiring electrode that are stacked in stated order. A second perimeter structure is provided in a perimeter portion of the second wiring electrode in the plan view of the semiconductor layer, the second perimeter structure protruding upward of the semiconductor device and including the gate electrode, the protective film, and the second wiring electrode that are stacked in stated order.

18 Claims, 12 Drawing Sheets

Related U.S. Application Data continuation of application No. PCT/JP2023/033097, filed on Sep. 11, 2023.

(60) Provisional application No. 63/407,306, filed on Sep. 16, 2022.

(51) Int. Cl.
H10D 64/23 (2025.01)
H10D 64/27 (2025.01)

(56) References Cited

U.S. PATENT DOCUMENTS

| | | | | |
|---|---|---|---|---|
| 2014/0001539 A1* | 1/2014 | Yagi | .................... | H10D 30/668 |
| | | | | 257/328 |
| 2015/0179551 A1 | 6/2015 | Nakamura et al. | | |
| 2015/0295028 A1 | 10/2015 | Kagata et al. | | |
| 2018/0096991 A1* | 4/2018 | Nasu | .................... | H10D 84/83 |
| 2018/0122939 A1 | 5/2018 | Ota et al. | | |
| 2018/0240914 A1 | 8/2018 | Nagaoka | | |
| 2019/0295957 A1 | 9/2019 | Inumiya et al. | | |
| 2020/0105677 A1 | 4/2020 | Chiba et al. | | |
| 2020/0335622 A1* | 10/2020 | Hiyoshi | ............... | H10D 30/668 |
| 2020/0395454 A1 | 12/2020 | Hamasaki et al. | | |
| 2021/0074827 A1 | 3/2021 | Nakamura | | |
| 2022/0181447 A1* | 6/2022 | Nagata | ................ | H01L 23/3171 |
| 2022/0319962 A1 | 10/2022 | Takenaka et al. | | |
| 2023/0105834 A1* | 4/2023 | Niwa | ................ | H01L 23/49568 |
| | | | | 257/669 |
| 2023/0343868 A1* | 10/2023 | Hikasa | .................... | H10D 8/00 |

FOREIGN PATENT DOCUMENTS

| | | | |
|---|---|---|---|
| JP | 2018-137393 | A | 8/2018 |
| JP | 2019-169579 | A | 10/2019 |
| JP | 2020-053593 | A | 4/2020 |
| KE | 10-2021-0005957 | A | 1/2021 |
| KR | 10-2021-0005957 | A | 1/2021 |
| WO | 2014/115561 | A1 | 7/2014 |
| WO | 2017/002368 | A1 | 1/2017 |
| WO | 2019/116481 | A1 | 6/2019 |

OTHER PUBLICATIONS

Decision to Grant a Patent dated Sep. 24, 2024 issued in Japanese Patent Application No. 2024-108085, with English translation.
Korean Office Action dated May 26, 2025 issued in the corresponding Korean Patent Application No. 10-2025-7007989.
Non-Final Office Action dated Jun. 30, 2025 issued in U.S. Appl. No. 19/075,303.

* cited by examiner

First wiring electrode
exposed portion (71)

Third wiring electrode
exposed portion

First opening
portion (61)

Third opening
portion (63)

SEMICONDUCTOR DEVICE AND MOUNTING SUBSTRATE

CROSS REFERENCE TO RELATED APPLICATIONS

This application is a divisional application of the U.S. patent application Ser. No. 19/075,303 filed on Mar. 10, 2025, which is a continuation application of PCT International Patent Application No. PCT/JP2023/033097 filed on Sep. 11, 2023, designating the United States of America, which is based on and claims priority of U.S. Provisional Patent Application No. 63/407,306 filed on Sep. 16, 2022. The entire disclosures of the above-identified applications, including the specifications, drawings and claims are incorporated herein by reference in their entirety.

FIELD

The present disclosure relates to a semiconductor device and a mounting substrate for mounting the semiconductor device.

BACKGROUND

Conventionally, semiconductor devices have been known (refer to Patent Literature (PTL) 1, for example).

CITATION LIST

Patent Literature

PTL 1: Japanese Unexamined Patent Application Publication No. 2019-169579

SUMMARY

Technical Problem

Recently, in order to reduce the space for a mounting substrate for mounting a semiconductor device, a mounting method for mounting a semiconductor device being embedded in a mounting substrate has been proposed.

In view of this, an object of the present disclosure is to provide, for instance, a semiconductor device having a structure suitable for a mounting method with which the semiconductor device is mounted being embedded in a mounting substrate.

Solution to Problem

A semiconductor device according to an aspect of the present disclosure is a semiconductor device that is a chip-size-package type semiconductor device, the semiconductor device including: a semiconductor layer; a vertical metal-oxide semiconductor (MOS) transistor provided in the semiconductor layer; a protective film that covers an upper surface of the vertical MOS transistor and includes: a first opening portion through which a source electrode of the vertical MOS transistor is exposed to an outside of the protective film; and a second opening portion through which a gate electrode of the vertical MOS transistor is exposed to the outside of the protective film; a first wiring electrode that includes copper as a principal component, thoroughly covers an exposed portion of the source electrode that is exposed to the outside of the protective film in the first opening portion, and is connected to the source electrode; and a second wiring electrode that includes copper as a principal component, thoroughly covers an exposed portion of the gate electrode that is exposed to the outside of the protective film in the second opening portion, and is connected to the gate electrode. The semiconductor device is rectangular in a plan view of the semiconductor layer. An entirety of a perimeter of the first opening portion is enclosed by the protective film. An entirety of a perimeter of the second opening portion is enclosed by the protective film. A first perimeter structure is provided in a perimeter portion of the first wiring electrode in the plan view of the semiconductor layer, the first perimeter structure including the source electrode, the protective film, and the first wiring electrode that are stacked in stated order. An uppermost layer of the first perimeter structure is the first wiring electrode. A second perimeter structure is provided in a perimeter portion of the second wiring electrode in the plan view of the semiconductor layer, the second perimeter structure including the gate electrode, the protective film, and the second wiring electrode that are stacked in stated order. An uppermost layer of the second perimeter structure is the second wiring electrode. A first wiring electrode exposed portion that is an upper surface of the first wiring electrode is exposed to an outside of the semiconductor device. A second wiring electrode exposed portion that is an upper surface of the second wiring electrode is exposed to the outside of the semiconductor device. The first perimeter structure protrudes above an upper surface of a portion of the first wiring electrode exposed portion, the portion not being included in the first perimeter structure. The second perimeter structure protrudes above an upper surface of a portion of the second wiring electrode exposed portion, the portion not being included in the second perimeter structure. A highest position of the semiconductor device is located in at least one of the first perimeter structure or the second perimeter structure. In the plan view of the semiconductor layer, an area of the first wiring electrode exposed portion is larger than an area of the first opening portion. In the plan view of the semiconductor layer, an area of the second wiring electrode exposed portion is larger than an area of the second opening portion. The semiconductor device further comprises a metal layer provided in contact with a lower surface of the semiconductor layer. A thickness of the metal layer is greater than a greatest thickness of the first wiring electrode. In a cross-sectional view of the semiconductor layer, the first wiring electrode includes a wall surface in a reverse tapered shape toward an outside of the first wiring electrode, in the perimeter portion in the plan view of the semiconductor layer, and the wall surface is not in contact with the protective film.

A semiconductor device according to an aspect of the present disclosure is a semiconductor device that is a chip-size-package type semiconductor device, the semiconductor device including: a semiconductor layer; a vertical metal-oxide semiconductor (MOS) transistor provided in the semiconductor layer; a protective film that covers an upper surface of the vertical MOS transistor and includes: a first opening portion through which a source electrode of the vertical MOS transistor is exposed to an outside of the protective film; and a second opening portion through which a gate electrode of the vertical MOS transistor is exposed to the outside of the protective film; a first wiring electrode that includes copper as a principal component, thoroughly covers an exposed portion of the source electrode that is exposed to the outside of the protective film in the first opening portion, and is connected to the source electrode; and a second wiring electrode that includes copper as a principal component, thoroughly covers an exposed portion of the gate electrode that is exposed to the outside of the protective film in the second opening portion, and is connected to the gate electrode. The semiconductor device is rectangular in a plan view of the semiconductor layer. An entirety of a perimeter of the first opening portion is enclosed by the protective film. An entirety of a perimeter of the second opening portion is enclosed by the protective film. The protective film is a multi-layer structure that includes a plurality of protective film layers including a first protective film layer and a second protective film layer located above the first protective film layer. A first perimeter structure is provided in a perimeter portion of the first wiring electrode in the plan view of the semiconductor layer, the first perimeter structure including the source electrode, the first protective film layer, the first wiring electrode, and the second protective film layer that are stacked in stated order. An uppermost layer of the first perimeter structure is the second protective film layer. A second perimeter structure is provided in a perimeter portion of the second wiring electrode in the plan view of the semiconductor layer, the second perimeter structure including the gate electrode, the first protective film layer, the second wiring electrode, and the second protective film layer that are stacked in stated order. An uppermost layer of the second perimeter structure is the second protective film layer. A first wiring electrode exposed portion that is a portion of an upper surface of the first wiring electrode is exposed to an outside of the semiconductor device, the portion not being included in the first perimeter structure. A second wiring electrode exposed portion that is a portion of an upper surface of the second wiring electrode is exposed to the outside of the semiconductor device, the portion not being included in the second perimeter structure. The first perimeter structure protrudes above an upper surface of the first wiring electrode exposed portion. The second perimeter structure protrudes above an upper surface of the second wiring electrode exposed portion. A highest position of the semiconductor device is located in at least one of the first perimeter structure or the second perimeter structure. When a thickness of the first wiring electrode in the first perimeter structure is a first thickness and a thickness of the second protective film layer in the first perimeter structure is a second thickness, the second thickness is less than or equal to the first thickness, and in a cross-sectional view of the semiconductor layer, the first wiring electrode includes a wall surface in a reverse tapered shape toward an outside of the first wiring electrode, in the perimeter portion in the plan view of the semiconductor layer.

A mounting substrate according to an aspect of the present disclosure is a mounting substrate in which a first wiring layer, an interlayer insulating layer, and a second wiring layer are stacked in stated order, the mounting substrate including: the above-stated semiconductor device that is mounted faceup in the interlayer insulating layer; a first wiring provided in the second wiring layer; and one or more first connection wirings that connect the first wiring and a portion of an upper surface of the first wiring electrode and extend in a direction orthogonal to the mounting substrate, the portion not overlapping the first perimeter structure in the plan view of the semiconductor layer.

Advantageous Effects

According to a semiconductor device and others according to aspects of the present disclosure, a semiconductor device having a structure suitable for a mounting method with which the semiconductor device is mounted being embedded in a mounting substrate, for instance, is provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figures 1, 2:
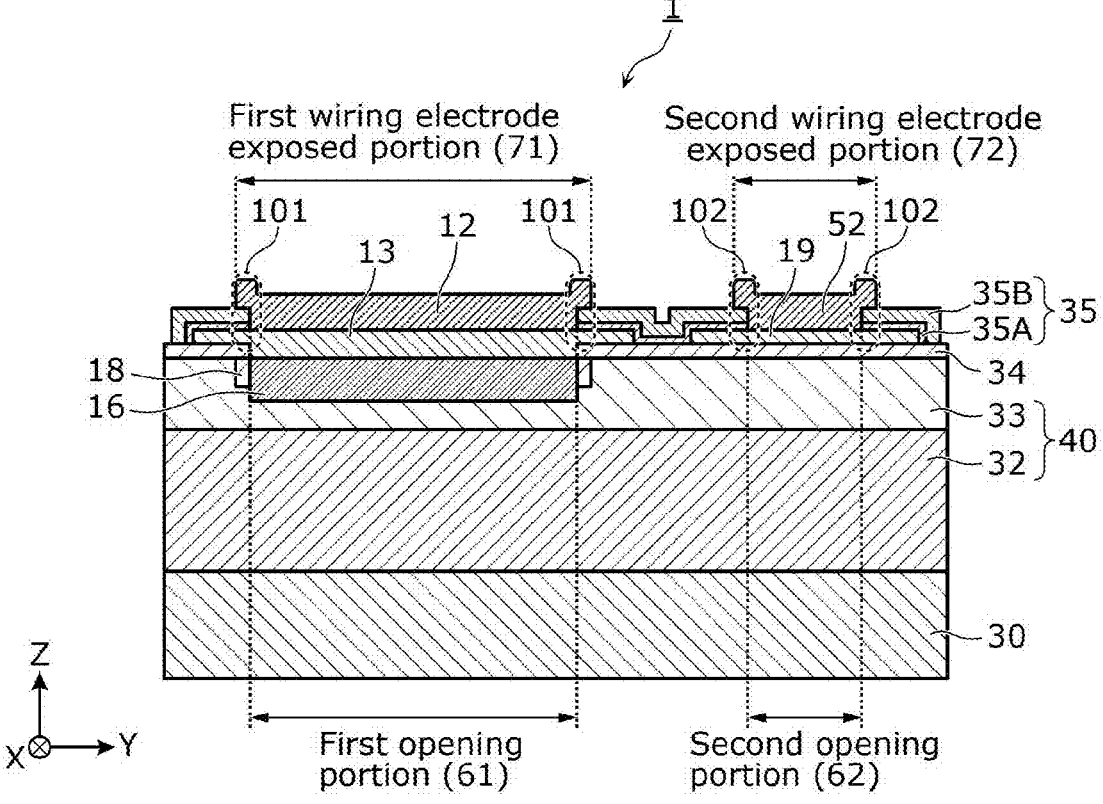
FIG. 1 is a plan view illustrating an example of a structure of a semiconductor device according to Embodiment 1.
FIG. 2 is a cross sectional view illustrating an example of a structure of the semiconductor device according to Embodiment 1.

[Circumstances Leading to Aspects of the Present Disclosure]

The inventors have been developing semiconductor devices that include vertical metal oxide semiconductor (MOS) transistors.

Meanwhile, in recent years, there has been a demand for reduction in space for a mounting substrate for mounting a semiconductor device.

In order to meet such a demand, the inventors considered that the space for a mounting substrate could be reduced if a semiconductor device could be mounted being embedded in the mounting substrate.

In view of this, the inventors decided, based on this idea, to develop a semiconductor device that includes a vertical MOS transistor and is faceup mounted being encapsulated in resin in the mounting substrate.

The inventors became aware through the development that there was a semiconductor device having a structure suitable for a mounting method with which the semiconductor device is mounted being embedded in the mounting substrate.

Stated differently, the inventors found that by providing the upper surface of a semiconductor device with a protrusion that digs in resin that encapsulates the semiconductor device, the protrusion plays a role as an anchor that fixes the position of the semiconductor device in the resin and as a result, resin can be prevented from coming off in the mounting substrate and the position of the semiconductor device in the mounting substrate can be stabilized.

Furthermore, the inventors found that when a protrusion is present on the upper surface of the semiconductor device, a protrusion that reflects the protrusion on the upper surface of the semiconductor device is also provided on the upper surface of the resin that has solidified after encapsulating the semiconductor device. The inventors found that by using the protrusion provided on the upper surface of the resin as a guideline when the mounting substrate is processed, the mounting substrate can be more accurately processed than the case in which such a protrusion is not present.

In view of this, the inventors repeatedly conducted further experiments and examinations, based on such findings. As a result, the inventors have conceived a semiconductor device and others according to the present disclosure as described below.

A semiconductor device according to an aspect of the present disclosure is a semiconductor device that is a faceup mountable, chip-size-package type semiconductor device, the semiconductor device including: a semiconductor layer; a vertical metal-oxide semiconductor (MOS) transistor provided in the semiconductor layer; a protective film that covers an upper surface of the vertical MOS transistor and includes: a first opening portion through which a source electrode of the vertical MOS transistor is exposed to an outside of the protective film; and a second opening portion through which a gate electrode of the vertical MOS transistor is exposed to the outside of the protective film; a first wiring electrode that includes copper as a principal component, thoroughly covers an exposed portion of the source electrode that is exposed to the outside of the protective film in the first opening portion, and is connected to the source electrode; and a second wiring electrode that includes copper as a principal component, thoroughly covers an exposed portion of the gate electrode that is exposed to the outside of the protective film in the second opening portion, and is connected to the gate electrode. The semiconductor device is rectangular in a plan view of the semiconductor layer. A first perimeter structure is provided in a perimeter portion of the first wiring electrode in the plan view of the semiconductor layer, the first perimeter structure including the source electrode, the protective film, and the first wiring electrode that are stacked in stated order. An uppermost layer of the first perimeter structure is the first wiring electrode. A second perimeter structure is provided in a perimeter portion of the second wiring electrode in the plan view of the semiconductor layer, the second perimeter structure including the gate electrode, the protective film, and the second wiring electrode that are stacked in stated order. An uppermost layer of the second perimeter structure is the second wiring electrode. A first wiring electrode exposed portion that is an upper surface of the first wiring electrode is exposed to an outside of the semiconductor device. A second wiring electrode exposed portion that is an upper surface of the second wiring electrode is exposed to the outside of the semiconductor device. The first perimeter structure protrudes above an upper surface of a portion of the first wiring electrode exposed portion, the portion not being included in the first perimeter structure. The second perimeter structure protrudes above an upper surface of a portion of the second wiring electrode exposed portion, the portion not being included in the second perimeter structure. A highest position of the semiconductor device is located in at least one of the first perimeter structure or the second perimeter structure. In the plan view of the semiconductor layer, an area of the first wiring electrode exposed portion is larger than an area of the first opening portion. In the plan view of the semiconductor layer, an area of the second wiring electrode exposed portion is larger than an area of the second opening portion, and when an area of the semiconductor layer in the plan view of the semiconductor layer is denoted by S [mm$^2$] and a thickness from a lower surface of the semiconductor layer to an upper surface of the protective film is denoted by h [mm], h/S≥0.025 is satisfied.

According to the semiconductor device having the above configuration, when the semiconductor device is faceup mounted being encapsulated in resin in the mounting substrate, the first perimeter structure and the second perimeter structure dig in the resin at the upper surface of the semiconductor device.

Accordingly, the first perimeter structure and the second perimeter structure digging in the resin play roles as anchors that fix the position of the semiconductor device in the resin, and as a result, resin can be prevented from coming off in the mounting substrate and the position of the semiconductor device in the mounting substrate can be stabilized.

After encapsulating the semiconductor device, protrusions that reflect the first perimeter structure and the second perimeter structure are provided on the upper surface of the resin that has solidified.

Accordingly, when a process of making, in the resin, a hole that reaches the first wiring electrode exposed portion from the upper surface of the resin is performed, a protrusion corresponding to the first perimeter structure and provided on the upper surface of the resin is used as a guideline and a process of making a hole on the inner side of the protrusion is performed, whereby the process of making a hole that reaches the first wiring electrode exposed portion from the upper surface of the resin can be performed more accurately than the case in which such a protrusion is not present.

Furthermore, similarly, when a process of making, in the resin, a hole that reaches the second wiring electrode exposed portion from the upper surface of the resin is performed, a protrusion corresponding to the second perimeter structure and provided on the upper surface of the resin is used as a guideline and a process of making a hole on the inner side of the protrusion is performed, whereby the process of making a hole that reaches the second wiring electrode exposed portion from the upper surface of the resin can be performed more accurately than the case in which such a protrusion is not present.

As described above, according to the semiconductor device having the above configuration, a semiconductor device having a structure suitable for a mounting method with which the semiconductor device is mounted being embedded in a mounting substrate is provided.

The semiconductor device may further include a metal layer provided in contact with a lower surface of the semiconductor layer, a thickness of the metal layer may be greater than a greatest thickness of the first wiring electrode, in a cross-sectional view of the semiconductor layer, the first wiring electrode may include a wall surface in a reverse tapered shape toward an outside of the first wiring electrode, in the perimeter portion in the plan view of the semiconductor layer, and the wall surface may not be in contact with the protective film.

In the cross-sectional view, the protective film may include a tapered region in a tapered shape toward the first opening portion in a portion in vicinity of the first opening portion in the plan view of the semiconductor layer, and in the plan view of the semiconductor layer, the wall surface may be located within the tapered region.

A semiconductor device according to an aspect of the present disclosure is a semiconductor device that is a faceup mountable, chip-size-package type semiconductor device, the semiconductor device including: a semiconductor layer; a vertical metal-oxide semiconductor (MOS) transistor provided in the semiconductor layer; a protective film that covers an upper surface of the vertical MOS transistor and includes: a first opening portion through which a source electrode of the vertical MOS transistor is exposed to an outside of the protective film; and a second opening portion through which a gate electrode of the vertical MOS transistor is exposed to the outside of the protective film; a first wiring electrode that includes copper as a principal component, thoroughly covers an exposed portion of the source electrode that is exposed to the outside of the protective film in the first opening portion, and is connected to the source electrode; and a second wiring electrode that includes copper as a principal component, thoroughly covers an exposed portion of the gate electrode that is exposed to the outside of the protective film in the second opening portion, and is connected to the gate electrode. The semiconductor device is rectangular in a plan view of the semiconductor layer. The protective film is a multi-layer structure that includes a plurality of protective film layers including a first protective film layer and a second protective film layer located above the first protective film layer. A first perimeter structure is provided in a perimeter portion of the first wiring electrode in the plan view of the semiconductor layer, the first perimeter structure including the source electrode, the first protective film layer, the first wiring electrode, and the second protective film layer that are stacked in stated order. An uppermost layer of the first perimeter structure is the second protective film layer. A second perimeter structure is provided in a perimeter portion of the second wiring electrode in the plan view of the semiconductor layer, the second perimeter structure including the gate electrode, the first protective film layer, the second wiring electrode, and the second protective film layer that are stacked in stated order. An uppermost layer of the second perimeter structure is the second protective film layer. A first wiring electrode exposed portion that is a portion of an upper surface of the first wiring electrode is exposed to an outside of the semiconductor device, the portion not being included in the first perimeter structure. A second wiring electrode exposed portion that is a portion of an upper surface of the second wiring electrode is exposed to the outside of the semiconductor device, the portion not being included in the second perimeter structure. The first perimeter structure protrudes above an upper surface of the first wiring electrode exposed portion. The second perimeter structure protrudes above an upper surface of the second wiring electrode exposed portion. A highest position of the semiconductor device is located in at least one of the first perimeter structure or the second perimeter structure. When a thickness of the first wiring electrode in the first perimeter structure is a first thickness and a thickness of the second protective film layer in the first perimeter structure is a second thickness, the second thickness is greater than half the first thickness and less than or equal to the first thickness, in the plan view of the semiconductor layer, an area of the first wiring electrode exposed portion is larger than an area of the first opening portion, and in the plan view of the semiconductor layer, an area of the second wiring electrode exposed portion is larger than an area of the second opening portion.

According to the semiconductor device having the above configuration, when the semiconductor device is faceup mounted being encapsulated in resin in the mounting substrate, the first perimeter structure and the second perimeter structure dig in the resin at the upper surface of the semiconductor device.

Accordingly, the first perimeter structure and the second perimeter structure digging in the resin play roles as anchors that fix the position of the semiconductor device in the resin, and as a result, resin can be prevented from coming off in the mounting substrate and the position of the semiconductor device in the mounting substrate can be stabilized.

After encapsulating the semiconductor device, protrusions that reflect the first perimeter structure and the second perimeter structure are provided on the upper surface of the resin that has solidified.

Accordingly, when a process of making, in the resin, a hole that reaches the first wiring electrode exposed portion from the upper surface of the resin is performed, a protrusion corresponding to the first perimeter structure and provided on the upper surface of the resin is used as a guideline and a process of making a hole on the inner side of the protrusion is performed, whereby the process of making a hole that reaches the first wiring electrode exposed portion from the upper surface of the resin can be performed more accurately than the case in which such a protrusion is not present.

Furthermore, similarly, when a process of making, in the resin, a hole that reaches the second wiring electrode exposed portion from the upper surface of the resin is performed, a protrusion corresponding to the second perimeter structure and provided on the upper surface of the resin is used as a guideline and a process of making a hole on the inner side of the protrusion is performed, whereby the process of making a hole that reaches the second wiring electrode exposed portion from the upper surface of the resin can be performed more accurately than the case in which such a protrusion is not present.

As described above, according to the semiconductor device having the above configuration, a semiconductor device having a structure suitable for a mounting method with which the semiconductor device is mounted being embedded in a mounting substrate is provided.

A smallest width of a portion of the second protective film layer that overlaps the first wiring electrode in the plan view of the semiconductor layer may be greater than the thickness of a portion of the second protective film layer that does not overlap the first wiring electrode or the second wiring electrode in the plan view of the semiconductor layer, and a smallest width of a portion of the second protective film layer that overlaps the second wiring electrode in the plan view of the semiconductor layer may be greater than the thickness of a portion of the second protective film layer that does not overlap the first wiring electrode or the second wiring electrode in the plan view of the semiconductor layer.

The height of the first perimeter structure from the upper surface of the first wiring electrode exposed portion as a reference may be greater than or equal to 50% of the thickness of the first wiring electrode in the first opening portion, and the height of the second perimeter structure from the upper surface of the second wiring electrode exposed portion as a reference may be greater than or equal to 50% of the thickness of the second wiring electrode in the second opening portion.

When an area of the source electrode in the plan view of the semiconductor layer is denoted by M1 and an area of the first opening portion in the plan view of the semiconductor layer is denoted by S1, a first occupancy ratio expressed by S1/M1 may be greater than or equal to 0.5 and less than 1.0, the first occupancy ratio being an occupancy ratio at which the area of the first opening portion in the plan view of the semiconductor layer occupies the area of the source electrode in the plan view of the semiconductor layer.

The first occupancy ratio may be greater than or equal to 0.9 and less than 1.0, and when an area of the first wiring electrode exposed portion in the plan view of the semiconductor layer is denoted by P1, a second occupancy ratio expressed by P1/M1 may be greater than or equal to 0.9 and less than 1.1, the second occupancy ratio being an occupancy ratio at which the area of the first wiring electrode exposed portion in the plan view of the semiconductor layer occupies the area of the source electrode in the plan view of the semiconductor layer.

When the area of the second opening portion in the plan view of the semiconductor layer is denoted by S2 and the area of the second wiring electrode exposed portion in the plan view of the semiconductor layer is denoted by P2, a third occupancy ratio expressed by P2/S2 may be greater than or equal to 1.27, the third occupancy ratio being an occupancy ratio at which the area of the second wiring electrode exposed portion in the plan view of the semiconductor layer occupies the area of the second opening portion in the plan view of the semiconductor layer.

In the plan view of the semiconductor layer, the shape of the first wiring electrode and the shape of the second wiring electrode may be axisymmetric with respect to a center line as an axis of symmetry, and the center line may bisect the area of the semiconductor device.

A mounting substrate according to an aspect of the present disclosure is a mounting substrate in which a first wiring layer, an interlayer insulating layer, and a second wiring layer are stacked in stated order, the mounting substrate including: the above-stated semiconductor device that is mounted faceup in the interlayer insulating layer; a first wiring provided in the second wiring layer; and one or more first connection wirings that connect the first wiring and a portion of an upper surface of the first wiring electrode and extend in a direction orthogonal to the mounting substrate, the portion not overlapping the first perimeter structure in the plan view of the semiconductor layer.

According to the mounting substrate having the above configuration, the first perimeter structure and the second perimeter structure dig in a material of the interlayer insulating layer, at the upper surface of the semiconductor device.

Accordingly, the first perimeter structure and the second perimeter structure digging in the material of the interlayer insulating layer play roles as anchors that fix the position of the semiconductor device in the interlayer insulating layer, and as a result, the interlayer insulating layer can be prevented from coming off in the mounting substrate and the position of the semiconductor device in the mounting substrate can be stabilized.

When the material of the interlayer insulating layer is, for example, resin, protrusions that reflect the first perimeter structure and the second perimeter structure are provided on the upper surface of the resin that has solidified after encapsulating the semiconductor device, or stated differently, the upper surface of the interlayer insulating layer.

Accordingly, when a process of making, in the interlayer insulating layer, a hole that reaches the first wiring electrode exposed portion from the upper surface of the interlayer insulating layer is performed, a protrusion corresponding to the first perimeter structure and provided on the upper surface of the interlayer insulating layer is used as a guideline and a process of making a hole on the inner side of the protrusion is performed, whereby the process of making a hole that reaches the first wiring electrode exposed portion from the upper surface of the interlayer insulating layer can be performed more accurately than the case in which such a protrusion is not present.

Furthermore, similarly, when a process of making, in the interlayer insulating layer, a hole that reaches the second wiring electrode exposed portion from the upper surface of the interlayer insulating layer is performed, a protrusion corresponding to the second perimeter structure and provided on the upper surface of the interlayer insulating layer is used as a guideline and a process of making a hole on the inner side of the protrusion is performed, whereby the process of making a hole that reaches the second wiring electrode exposed portion from the upper surface of the interlayer insulating layer can be performed more accurately than the case in which such a protrusion is not present.

As described above, according to the mounting substrate having the above configuration, a mounting substrate for mounting a semiconductor device having a structure suitable for a mounting method with which the semiconductor device is mounted being embedded in the mounting substrate is provided.

The mounting substrate may further include: a second wiring provided in the second wiring layer; and a second connection wiring that connects the second wiring and a portion of an upper surface of the second wiring electrode and extends in a direction orthogonal to the mounting substrate, the portion not overlapping the second perimeter structure in the plan view of the semiconductor layer. The one or more first connection wirings may each have a circular cross section orthogonal to the direction in which the one or more first connection wirings extend, and the second connection wiring may have a circular cross section orthogonal to the direction in which the second connection wiring extends, and the circular cross section of at least one of the one or more first connection wirings may be larger than the circular cross section of the second connection wiring.

A mounting substrate according to an aspect of the present disclosure is a mounting substrate in which a first wiring layer, an interlayer insulating layer, and a second wiring layer are stacked in stated order, the mounting substrate including: a semiconductor device that is mounted faceup in the interlayer insulating layer, includes a semiconductor layer, and includes a first wiring electrode on an upper surface; a first wiring provided in the second wiring layer; and one or more first connection wirings that connect the first wiring and an upper surface of the first wiring electrode and extend in a direction orthogonal to the mounting substrate. In the semiconductor device, a first perimeter structure is provided in a perimeter portion of the first wiring electrode in the plan view of the semiconductor layer. The first perimeter structure protrudes above a portion of an upper surface of the first wiring electrode, the portion not overlapping the first perimeter structure in the plan view of the semiconductor layer. A highest position of the semiconductor device is located in the first perimeter structure. The first wiring electrode is exposed to the outside of the semiconductor device at least in the portion of the upper surface of the first wiring electrode that does not overlap the first perimeter structure in the plan view of the semiconductor layer. The one or more first connection wirings are connected to the upper surface of the first wiring electrode in the portion of the upper surface of the first wiring electrode of the semiconductor device, the portion not overlapping the first perimeter structure in the plan view of the semiconductor layer.

According to the mounting substrate having the above configuration, the first perimeter structure digs in a material of the interlayer insulating layer, at the upper surface of the semiconductor device.

Accordingly, the first perimeter structure that digs in the material of the interlayer insulating layer plays a role as an anchor that fixes the position of the semiconductor device in the interlayer insulating layer, and as a result, the interlayer insulating layer can be prevented from coming off in the mounting substrate and the position of the semiconductor device in the mounting substrate can be stabilized.

When the material of the interlayer insulating layer is, for example, resin, a protrusion that reflects the first perimeter structure is provided on the upper surface of the resin that has solidified after encapsulating the semiconductor device, or stated differently, such a protrusion is provided on the upper surface of the interlayer insulating layer.

Accordingly, when a process of making, in the interlayer insulating layer, a hole that reaches the first wiring electrode exposed portion from the upper surface of the interlayer insulating layer is performed, a protrusion corresponding to the first perimeter structure and provided on the upper surface of the interlayer insulating layer is used as a guideline and a process of making a hole on the inner side of the protrusion is performed, whereby the process of making a hole that reaches the first wiring electrode exposed portion from the upper surface of the interlayer insulating layer can be performed more accurately than the case in which such a protrusion is not present.

As described above, according to the mounting substrate having the above configuration, a mounting substrate for mounting a semiconductor device having a structure suitable for a mounting method with which the semiconductor device is mounted being embedded in the mounting substrate is provided.

The one or more first connection wirings may be a plurality of first connection wirings.

A height from a lowest position of the upper surface of the first wiring electrode as a reference to the highest position of the semiconductor device may be greater than or equal to 15% of a length of the one or more first connection wirings in the direction orthogonal to the mounting substrate.

A plurality of first wiring electrodes each of which is the first wiring electrode may be provided. The one or more first connection wirings may be a plurality of first connection wirings in one-to-one correspondence with the plurality of first wiring electrodes. Each of the plurality of first connection wirings may be connected to the first wiring by a corresponding one of the plurality of first wiring electrodes in one-to-one correspondence with the plurality of first connection wirings, and the plurality of first connection wirings may have cross sections in a same shape, the cross sections being orthogonal to a direction in which the plurality of first connection wirings extend.

In a plan view of the mounting substrate, the mounting substrate may be in a shape having a longer direction, the semiconductor device may be in a shape having a longer direction, and the longer direction of the mounting substrate and the longer direction of the semiconductor device may be orthogonal to each other.

The mounting substrate may further include: an electronic component disposed above the interlayer insulating layer. In a plan view of the mounting substrate, the electronic component may be in a shape having a longer direction, the semiconductor device may be in a shape having a longer direction, at least a portion of the electronic component may overlap the semiconductor device, and the longer direction of the electronic component and the longer direction of the semiconductor device may be orthogonal to each other.

Hereinafter, specific examples of a semiconductor device and others according to aspects of the present disclosure are to be described with reference to the drawings. The embodiments shown herein show specific examples of the present disclosure. Thus, the numerical values, shapes, elements, the arrangement and connection of the elements, steps (processes), and the processing order of the steps, for instance, described in the following embodiments are mere examples, and thus are not intended to limit the present disclosure. The drawings are schematic diagrams, and do not necessarily provide strictly accurate illustrations. Throughout the drawings, the same reference sign is given to substantially the same element, and redundant description is omitted or simplified.

Embodiment 1 in the following, a semiconductor device according to Embodiment 1 is to be described. The semiconductor device is a faceup mountable, chip-size-package type semiconductor device, and is a semiconductor device having a structure suitable for a mounting method with which the semiconductor device is mounted being embedded in a mounting substrate.

<Structure>

In the following, a structure of the semiconductor device according to Embodiment 1 is to be described. A semiconductor device according to Embodiment 1 is a faceup mountable, chip-size-package (CSP) type semiconductor device in which N vertical metal oxide semiconductor (MOS) transistor(s) is/are provided, where N is an integer greater than or equal to 1. Each of such N vertical MOS transistors is a so-called trench-type MOS field effect transistor (MOSFET).

In the present disclosure, a description is given assuming that N is 2, but nevertheless N is not necessarily limited to 2, so that N may be 1 or greater than or equal to 3.

FIG. 1 is a plan view illustrating an example of a structure of semiconductor device 1 according to Embodiment 1. As illustrated in FIG. 1, semiconductor device 1 is rectangular in the plan view of semiconductor device 1 (that is, in the plan view of semiconductor layer 40 described later).

Figure 3:
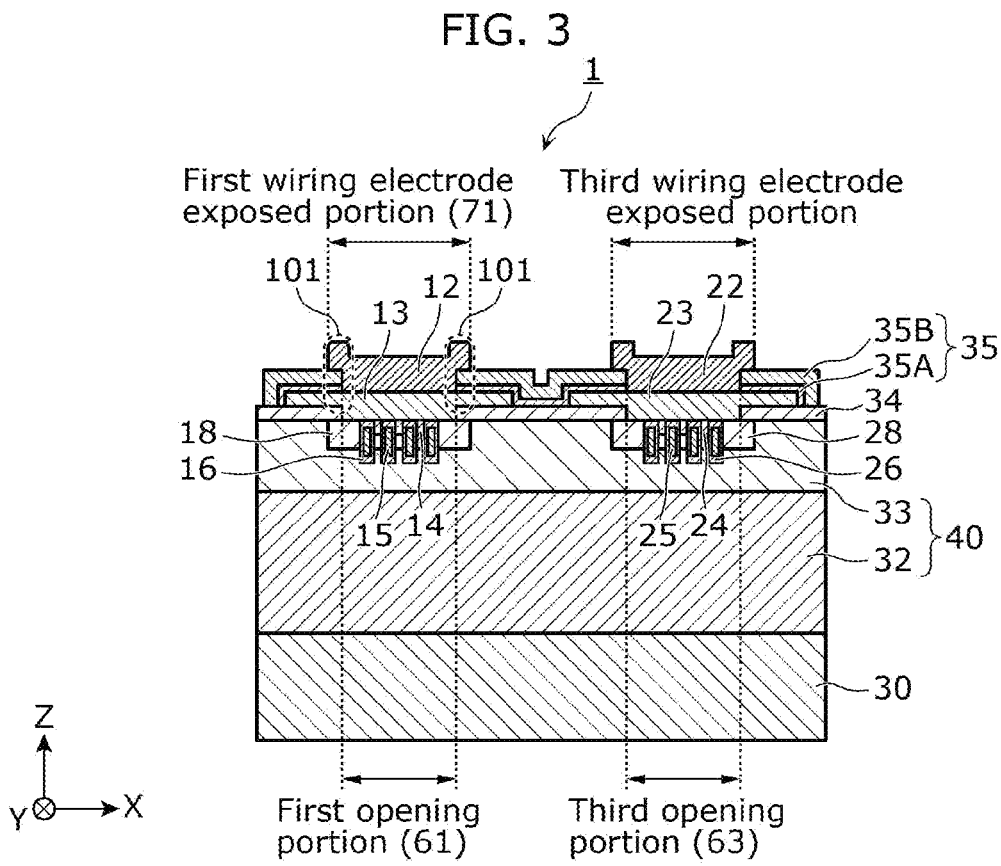
FIG. 3 is a cross sectional view illustrating an example of a structure of the semiconductor device according to Embodiment 1.

FIG. 2 and FIG. 3 are cross sectional views each illustrating an example of a structure of semiconductor device 1. FIG. 2 illustrates a cut surface along I-I in FIG. 1, whereas FIG. 3 illustrates a cut surface along II-II in FIG. 1.

As illustrated in FIG. 1 to FIG. 3, semiconductor device 1 includes metal layer 30, semiconductor layer 40, oxide film 34, protective film 35, first vertical MOS transistor 10 provided in semiconductor layer 40, second vertical MOS transistor 20 provided in semiconductor layer 40, first source electrode 13 that functions as a source electrode of first vertical MOS transistor 10, first gate electrode 19 that functions as a gate electrode of first vertical MOS transistor 10, second source electrode 23 that functions as a source electrode of second vertical MOS transistor 20, second gate electrode 29 that functions as a gate electrode of second vertical MOS transistor 20, first wiring electrode 12 connected to first source electrode 13, second wiring electrode 52 connected to first gate electrode 19, third wiring electrode 22 connected to second source electrode 23, and fourth wiring electrode 54 connected to second gate electrode 29.

In the present disclosure, a description is given assuming that semiconductor device 1 includes metal layer 30, but nevertheless the configuration of semiconductor device 1 is not necessarily limited to the configuration that includes metal layer 30.

Note that in FIG. 1, first source electrode 13, first gate electrode 19, second source electrode 23, second gate electrode 29, later-described first opening portion 61, later-described second opening portion 62, later-described third opening portion 63, and later-described fourth opening portion 64 are illustrated by broken lines as if they are visible, but actually these elements cannot be directly viewed from the outside of semiconductor device 1.

Semiconductor layer 40 is configured by stacking semiconductor substrate 32 and low-concentration impurity layer 33.

Here, h/S≥0.025 is satisfied when the area of semiconductor layer 40 in the plan view of semiconductor layer 40 is denoted by S [mm²] and the thickness from the lower surface of semiconductor layer 40 to the upper surface of protective film 35 is denoted by h [mm].

Semiconductor substrate 32 is disposed closer to the lower surface of semiconductor layer 40, and comprises silicon that includes impurities of a first conductivity type.

Low-concentration impurity layer 33 is disposed closer to the upper surface of semiconductor layer 40, is provided in contact with semiconductor substrate 32, and includes impurities of the first conductivity type having a lower concentration than the concentration of the impurities of the first conductivity type of semiconductor substrate 32. Low-concentration impurity layer 33 may be provided on semiconductor substrate 32 by epitaxial growth, for example.

Oxide film 34 is disposed on the upper surface of semiconductor layer 40, and is provided in contact with low-concentration impurity layer 33.

Protective film 35 covers the upper surface of first vertical MOS transistor 10 and the upper surface of second vertical MOS transistor 20, and includes first opening portion 61 through which first source electrode 13 is exposed to an outside of protective film 35, second opening portion 62 through which first gate electrode 19 is exposed to the outside of protective film 35, third opening portion 63 through which second source electrode 23 is exposed to the outside of protective film 35, and fourth opening portion 64 through which second gate electrode 29 is exposed to the outside of protective film 35.

Here, protective film 35 covering the upper surface of first vertical MOS transistor 10 and the upper surface of second vertical MOS transistor 20 refers to a state in which protective film 35 is provided over substantially the entire surface of semiconductor device 1 except opening portions in the plan view of semiconductor layer 40. Here, substantially the entire surface of semiconductor device 1 refers to the entire surface of semiconductor device 1 except the perimeter region that is slightly left along the four sides of semiconductor device 1 after being diced, out of the wafer region allocated as a dicing margin for when semiconductor device 1 is cut out from the wafer by being diced. For this reason, oxide film 34 is exposed from the upper surface of semiconductor device 1, exceptionally in the perimeter region.

The opening portions of protective film 35 in the present disclosure each refer to a shape where the entire perimeter of the opening portion is enclosed by protective film 35 in the plan view of semiconductor layer 40. For this reason, in the plan view of semiconductor layer 40, a shape in which a portion of the perimeter overlaps the perimeter region in which oxide film 34 is exceptionally exposed from the upper surface of semiconductor device 1 as stated above does not correspond to an opening portion of protective film 35 in the present disclosure.

In the present disclosure, a description is given assuming that protective film 35 includes one first opening portion 61 as an opening portion through which first source electrode 13 is exposed to the outside of protective film 35, but protective film 35 may include a plurality of opening portions as opening portions through which first source electrode 13 is exposed to the outside of protective film 35.

Similarly, in the present disclosure, a description is given assuming that protective film 35 includes one second opening portion 62 as an opening portion through which first gate electrode 19 is exposed to the outside of protective film 35, but protective film 35 may include a plurality of opening portions as opening portions through which first gate electrode 19 is exposed to the outside of protective film 35.

In the present disclosure, a description is given assuming that protective film 35 includes one third opening portion 63 as an opening portion through which second source electrode 23 is exposed to the outside of protective film 35, but protective film 35 may include a plurality of opening portions as opening portions through which second source electrode 23 is exposed to the outside of protective film 35.

Similarly, in the present disclosure, a description is given assuming that protective film 35 includes one fourth opening portion 64 as an opening portion through which second gate electrode 29 is exposed to the outside of protective film 35, but protective film 35 may include a plurality of opening portions as opening portions through which second gate electrode 29 is exposed to the outside of protective film 35.

Note that protective film 35 may be a single-layer structure or may be a multi-layer structure in which a plurality of layers are stacked. In the present disclosure, a description is given assuming that protective film 35 is a multi-layer structure (here, a two-layer structure) in which first protective film 35A and second protective film 35B located above first protective film 35A are stacked.

First protective film 35A may comprise silicon nitride as a non-limiting example, and has a thickness of 0.3 μm, for example.

Second protective film 35B may comprise polyimide as a non-limiting example, and has a thickness of 8 µm, for example.

Metal layer 30 is provided in contact with the lower surface of semiconductor substrate 32, may comprise silver, copper, nickel, or an alloy of one or more of the metals, or may comprise a metal material having a conductivity that is sufficiently high to allow metal layer 30 to function as an electrode. Note that metal layer 30 may include a trace amount of an element other than metal, which is mixed as an impurity in a process of manufacturing the metal material.

First body region 18 that includes impurities of a second conductivity type different from the first conductivity type is provided in a region of low-concentration impurity layer 33 in which first vertical MOS transistor 10 is provided. First source region 14 that includes impurities of the first conductivity type, first gate conductor 15, and first gate insulating film 16 are provided in first body region 18.

First source electrode 13 is connected to first source region 14 and first body region 18 via an opening of oxide film 34.

First source electrode 13 may comprise a metal material including at least one of aluminum, copper, gold, or silver, as a non-limiting example.

First wiring electrode 12 is connected to first source electrode 13, and thoroughly covers an exposed portion of first source electrode 13 that is exposed to the outside of protective film 35 in first opening portion 61. Accordingly, first source electrode 13 is prevented from being corroded by a material from the outside of semiconductor device 1.

First wiring electrode 12 includes copper as a principal component, and is provided by plating as a non-limiting example. First wiring electrode 12 has a thickness of 10 µm, for example.

Note that when protective film 35 also includes one or more opening portions through which first source electrode 13 is exposed to the outside of protective film 35, in addition to first opening portion 61, semiconductor device 1 includes one or more wiring electrodes similar to first wiring electrode 12, for the one or more opening portions.

First gate electrode 19 is electrically connected to first gate conductor 15.

First gate electrode 19 may comprise a metal material including at least one of aluminum, copper, gold, or silver, as a non-limiting example.

Second wiring electrode 52 is connected to first gate electrode 19, and thoroughly covers an exposed portion of first gate electrode 19 that is exposed to the outside of protective film 35 in second opening portion 62. Accordingly, first gate electrode 19 is prevented from being corroded by a material from the outside of semiconductor device 1.

Second wiring electrode 52 includes copper as a principal component, and is provided by plating as a non-limiting example. Second wiring electrode 52 has a thickness of 10 µm, for example.

Note that when protective film 35 also includes one or more opening portions through which first gate electrode 19 is exposed to the outside of protective film 35, in addition to second opening portion 62, semiconductor device 1 includes one or more wiring electrodes similar to second wiring electrode 52, for the one or more opening portions.

Second body region 28 that includes impurities of the second conductivity type different from the first conductivity type is provided in a region of low-concentration impurity layer 33 in which second vertical MOS transistor 20 is provided. Second source region 24 that includes impurities of the first conductivity type, second gate conductor 25, and second gate insulating film 26 are provided in second body region 28.

Second source electrode 23 is connected to second source region 24 and second body region 28 via an opening of oxide film 34.

Second source electrode 23 may comprise a metal material including at least one of aluminum, copper, gold, or silver, as a non-limiting example.

Third wiring electrode 22 is connected to second source electrode 23, and thoroughly covers an exposed portion of second source electrode 23 that is exposed to the outside of protective film 35 in third opening portion 63. Accordingly, second source electrode 23 is prevented from being corroded by a material from the outside of semiconductor device 1.

Third wiring electrode 22 includes copper as a principal component, and is provided by plating as a non-limiting example. Third wiring electrode 22 has a thickness of 10 µm, for example.

Note that when protective film 35 also includes one or more opening portions through which second source electrode 23 is exposed to the outside of protective film 35, in addition to third opening portion 63, semiconductor device 1 includes one or more wiring electrodes similar to third wiring electrode 22, for the one or more opening portions.

Second gate electrode 29 is electrically connected to second gate conductor 25.

Second gate electrode 29 may comprise a metal material including at least one of aluminum, copper, gold, or silver, as a non-limiting example.

Fourth wiring electrode 54 is connected to second gate electrode 29, and thoroughly covers an exposed portion of second gate electrode 29 that is exposed to the outside of protective film 35 in fourth opening portion 64. Accordingly, second gate electrode 29 is prevented from being corroded by a material from the outside of semiconductor device 1.

Fourth wiring electrode 54 includes copper as a principal component, and is provided by plating as a non-limiting example. Fourth wiring electrode 54 has a thickness of 10 µm, for example.

Note that when protective film 35 also includes one or more opening portions through which second gate electrode 29 is exposed to the outside of protective film 35, in addition to fourth opening portion 64, semiconductor device 1 includes one or more wiring electrodes similar to fourth wiring electrode 54, for the one or more opening portions.

Here, the greatest thickness of first wiring electrode 12, the greatest thickness of second wiring electrode 52, the greatest thickness of third wiring electrode 22, and the greatest thickness of fourth wiring electrode 54 are each less than the thickness of metal layer 30. Stated differently, the thickness of metal layer 30 is greater than the greatest thickness of first wiring electrode 12, the greatest thickness of second wiring electrode 52, the greatest thickness of third wiring electrode 22, and the greatest thickness of fourth wiring electrode 54.

In semiconductor device 1, for example, assuming that the first conductivity type is an N type and the second conductivity type is a P type, first source region 14, second source region 24, semiconductor substrate 32, and low-concentration impurity layer 33 may be N-type semiconductors, and first body region 18 and second body region 28 may be P-type semiconductors.

In semiconductor device 1, for example, assuming that the first conductivity type is a P type and the second conductivity type is an N type, first source region 14, second source region 24, semiconductor substrate 32, and low-concentration impurity layer 33 may be P-type semiconductors, and first body region 18 and second body region 28 may be N-type semiconductors.

In the present disclosure, a description is given assuming that first vertical MOS transistor 10 and second vertical MOS transistor 20 are so-called N channel transistors with the first conductivity type being an N type and the second conductivity type being a P type.

Furthermore, in the present disclosure, a description is given assuming that first vertical MOS transistor 10 and second vertical MOS transistor 20 are similar to each other, first source electrode 13 and second source electrode 23 are similar to each other, first gate electrode 19 and second gate electrode 29 are similar to each other, first wiring electrode 12 and third wiring electrode 22 are similar to each other, and second wiring electrode 52 and fourth wiring electrode 54 are similar to each other.

Accordingly, in the following, first vertical MOS transistor 10 is to be described as a representative of first vertical MOS transistor 10 and second vertical MOS transistor 20, first source electrode 13 is to be described as a representative of first source electrode 13 and second source electrode 23, first gate electrode 19 is to be described as a representative of first gate electrode 19 and second gate electrode 29, first wiring electrode 12 is to be described as a representative of first wiring electrode 12 and third wiring electrode 22, and second wiring electrode 52 is to be described as a representative of second wiring electrode 52 and fourth wiring electrode 54.

As illustrated in FIG. 2 and FIG. 3, the upper surface of first wiring electrode 12 is exposed to the outside of semiconductor device 1, and the upper surface of second wiring electrode 52 is exposed to the outside of semiconductor device 1.

In the present disclosure, a portion of the upper surface of first wiring electrode 12 which is exposed to the outside of semiconductor device 1 (semiconductor device 1A described later in Embodiment 2) is defined as first wiring electrode exposed portion 71, whereas a portion of the upper surface of second wiring electrode 52 which is exposed to the outside of semiconductor device 1 (semiconductor device 1A described later in Embodiment 2) is defined as second wiring electrode exposed portion 72.

Accordingly, in Embodiment 1, first wiring electrode exposed portion 71 is the upper surface of first wiring electrode 12, and second wiring electrode exposed portion 72 is the upper surface of second wiring electrode 52.

Stated differently, in Embodiment 1, first wiring electrode exposed portion 71 that is the upper surface of first wiring electrode 12 is exposed to the outside of semiconductor device 1, and second wiring electrode exposed portion 72 that is the upper surface of second wiring electrode 52 is exposed to the outside of semiconductor device 1.

Here, as illustrated in FIG. 1 to FIG. 3, in the plan view of semiconductor layer 40, the area of first wiring electrode exposed portion 71 is larger than the area of first opening portion 61, and the area of second wiring electrode exposed portion 72 is larger than the area of second opening portion 62.

As illustrated in FIG. 2 and FIG. 3, first perimeter structure 101 in which first source electrode 13, protective film 35, and first wiring electrode 12 are stacked in stated order is provided in a perimeter portion of first wiring electrode 12 in the plan view of semiconductor layer 40, and second perimeter structure 102 in which first gate electrode 19, protective film 35, and second wiring electrode 52 are stacked in stated order is provided in a perimeter portion of second wiring electrode 52 in the plan view of semiconductor layer 40.

Here, the uppermost layer of first perimeter structure 101 is first wiring electrode 12, and the uppermost layer of second perimeter structure 102 is second wiring electrode 52.

As illustrated in FIG. 2 and FIG. 3, first perimeter structure 101 protrudes above the upper surface of a portion of first wiring electrode exposed portion 71 which is not included in first perimeter structure 101, second perimeter structure 102 protrudes above the upper surface of a portion of second wiring electrode exposed portion 72 which is not included in second perimeter structure 102, and the highest position of semiconductor device 1 is located in at least one of first perimeter structure 101 or second perimeter structure 102.

Figure 4:
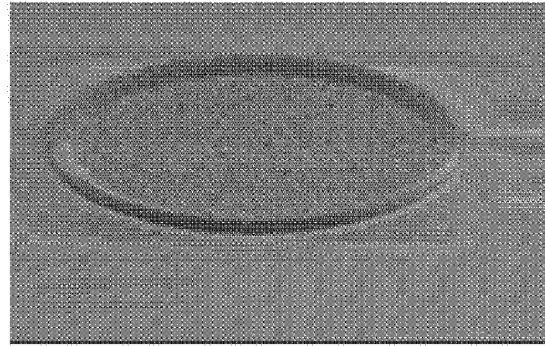
FIG. 4 shows a captured image obtained by capturing, from obliquely above, a portion of the upper surface of the semiconductor device according to Embodiment 1.

FIG. 4 shows a captured image obtained by capturing, from obliquely above semiconductor device 1, a portion of the upper surface of semiconductor device 1 in the vicinity of second wiring electrode 52.

It can be understood from FIG. 4 that second perimeter structure 102 that protrudes above the upper surface of a portion of second wiring electrode 52 that is not included in second perimeter structure 102 is provided in the perimeter portion of second wiring electrode 52 in the plan view of semiconductor layer 40.

Figure 5:
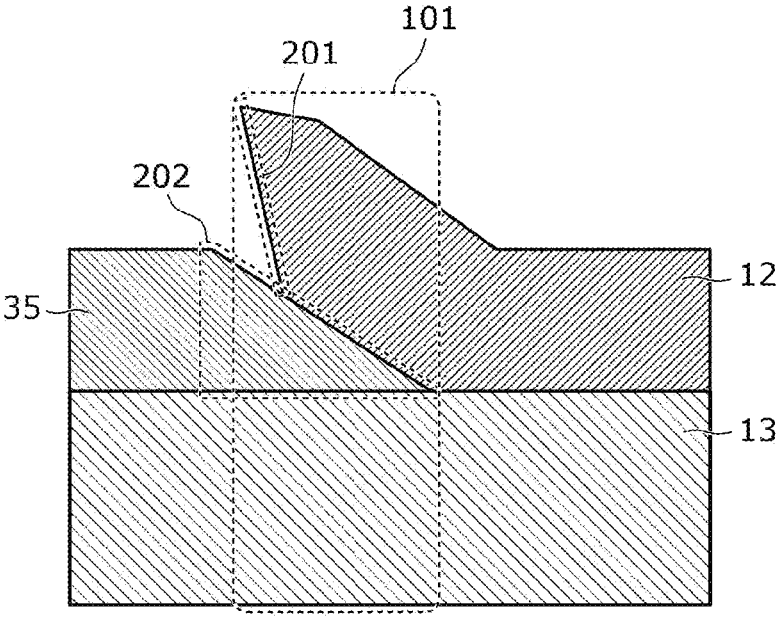
FIG. 5 is an enlarged cross-sectional view illustrating a structure of a first perimeter structure according to Embodiment 1.

FIG. 5 is an enlarged cross-sectional view illustrating a structure of first perimeter structure 101.

In the present disclosure, second perimeter structure 102 is to be described as being similar to first perimeter structure 101 while first source electrode 13 is read as first gate electrode 19.

Accordingly, in the following, first perimeter structure 101 and second perimeter structure 102 are to be described with reference to FIG. 5.

As illustrated in FIG. 5, in a cross-sectional view of semiconductor layer 40, first wiring electrode 12 includes first wall surface 201 in a reverse tapered shape toward an outside of first wiring electrode 12, in the perimeter portion in the plan view of semiconductor layer 40, and first wall surface 201 is not in contact with protective film 35.

As illustrated in FIG. 5, in the cross-sectional view of semiconductor layer 40, protective film 35 includes first tapered region 202 in a tapered shape toward first opening portion 61 in a portion in the vicinity of first opening portion 61 in the plan view of semiconductor layer 40.

Here, as illustrated in FIG. 5, in the plan view of semiconductor layer 40, first wall surface 201 is located within first tapered region 202.

Similarly, in the cross-sectional view of semiconductor layer 40, second wiring electrode 52 includes a second wall surface in a reverse tapered shape toward an outside of second wiring electrode 52, in the perimeter portion in the plan view of semiconductor layer 40, and the second wall surface is not in contact with protective film 35.

Similarly, in the cross-sectional view of semiconductor layer 40, protective film 35 includes a second tapered region in a tapered shape toward second opening portion 62 in a portion in the vicinity of second opening portion 62 in the plan view of semiconductor layer 40.

Here, similarly, the second wall surface is located within the second tapered region, in the plan view of semiconductor layer 40.

<Consideration>

According to semiconductor device 1 having the above configuration, when such semiconductor device 1 is faceup mounted, being encapsulated in resin in the mounting substrate, first perimeter structure 101 and second perimeter structure 102 dig in the resin at the upper surface of semiconductor device 1.

Accordingly, first perimeter structure 101 and second perimeter structure 102 digging in the resin play roles as anchors that fix the position of semiconductor device 1 in the resin, and as a result, resin can be prevented from coming off in the mounting substrate and the position of semiconductor device 1 in the mounting substrate can be stabilized.

Protrusions that reflect first perimeter structure 101 and second perimeter structure 102 are provided on the upper surface of the resin that has solidified after encapsulating semiconductor device 1.

Accordingly, when a process of making, in the resin, a hole that reaches first wiring electrode exposed portion 71 from the upper surface of the resin is performed, a protrusion corresponding to first perimeter structure 101 and provided on the upper surface of the resin is used as a guideline and a process of making a hole on the inner side of the protrusion is performed, whereby the process of making a hole that reaches first wiring electrode exposed portion 71 from the upper surface of the resin can be performed more accurately than the case in which such a protrusion is not present.

Furthermore, similarly, when a process of making, in the resin, a hole that reaches second wiring electrode exposed portion 72 from the upper surface of the resin is performed, a protrusion corresponding to second perimeter structure 102 and provided on the upper surface of the resin is used as a guideline and a process of making a hole on the inner side of the protrusion is performed, whereby the process of making a hole that reaches second wiring electrode exposed portion 72 from the upper surface of the resin can be performed more accurately than the case in which such a protrusion is not present.

As described above, according to semiconductor device 1 having the above configuration, a semiconductor device having a structure suitable for a mounting method with which the semiconductor device is mounted being embedded in a mounting substrate is provided.

As described above, in the plan view of semiconductor layer 40, the area of first wiring electrode exposed portion 71 is larger than the area of first opening portion 61, and the area of second wiring electrode exposed portion 72 is larger than the area of second opening portion 62.

Accordingly, as compared with the case in which in the plan view of semiconductor layer 40, the area of first wiring electrode exposed portion 71 is not larger than the area of first opening portion 61 and the area of second wiring electrode exposed portion 72 is not larger than the area of second opening portion 62, the degree of freedom of a process of making a hole that reaches first wiring electrode exposed portion 71 from the upper surface of the resin and the degree of freedom of a process of making a hole that reaches second wiring electrode exposed portion 72 from the upper surface of the resin can be increased.

When semiconductor device 1 is mounted being embedded in the mounting substrate, semiconductor device 1 may receive stress and impact from the mounting substrate. If a thickness from the lower surface of semiconductor layer 40 to the upper surface of protective film 35 (hereinafter, also referred to as "Si thickness") relative to the area of semiconductor device 1 (hereinafter, also referred to as "chip area") in the plan view of semiconductor layer 40 is excessively small, sufficient resistance of semiconductor device 1 to the stress and impact received from the mounting substrate cannot be obtained.

The inventors have conducted experiments and examinations on a relation between (i) the resistance of semiconductor device 1 to the stress and impact received from the mounting substrate and (ii) the shape and the Si thickness of semiconductor device 1 in the plan view of semiconductor layer 40. As a result, the inventors found that when the Si thickness is greater than or equal to 0.1 mm when the shape of semiconductor device 1 in the plan view of semiconductor layer 40 is 2 [mm]×2 [mm], semiconductor device 1 can obtain sufficient resistance to the stress and impact received from the mounting substrate.

The inventors repeatedly conducted further experiments and examinations based on such findings, and found that when the shape of semiconductor device 1 in the plan view of semiconductor layer 40 is made smaller than 2 [mm]×2 [mm], even if Si thickness h [mm] is decreased in proportion to chip area S [mm$^2$], semiconductor device 1 can obtain sufficient resistance to the stress and impact received from the mounting substrate, and found that when the shape of semiconductor device 1 in the plan view of semiconductor layer 40 is made larger than 2 [mm]×2 [mm], if Si thickness h [mm] is increased in proportion to chip area S [mm$^2$], semiconductor device 1 can obtain sufficient resistance to the stress and impact received from the mounting substrate.

Figure 6:
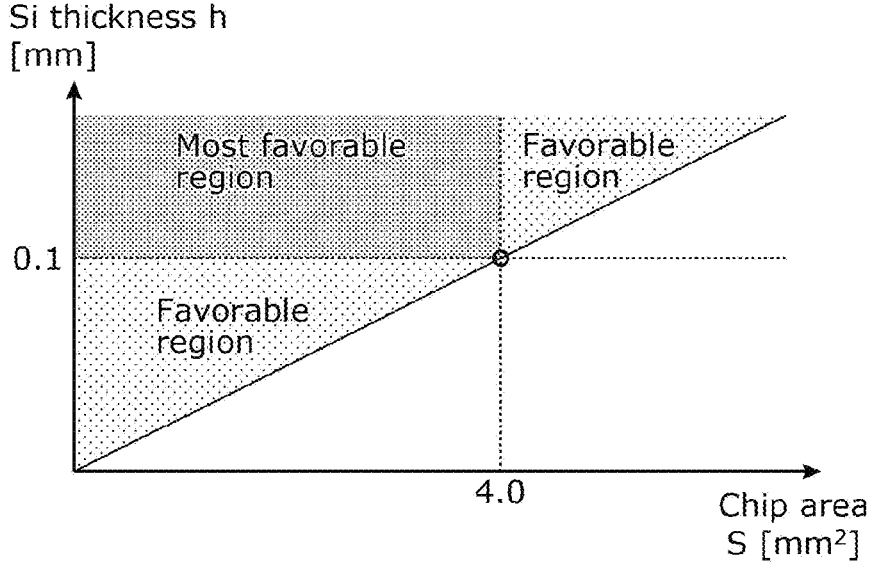
FIG. 6 is a schematic diagram illustrating a relation between (i) resistance of the semiconductor device according to Embodiment 1 and (ii) the shape and the Si thickness of the semiconductor device according to Embodiment 1.

FIG. 6 is a schematic diagram illustrating a relation between (i) resistance of semiconductor device 1 to the stress and impact received from the mounting substrate and (ii) the shape and the Si thickness of semiconductor device 1 in the plan view of semiconductor layer 40, which the inventors obtained through experiments and examinations.

As illustrated in FIG. 6, when the chip area is denoted by S [mm$^2$] and the Si thickness is denoted by h [mm], semiconductor device 1 can obtain sufficient resistance to the stress and impact received from the mounting substrate, in a range in which h/S≥0.025 is satisfied.

Figure 7:
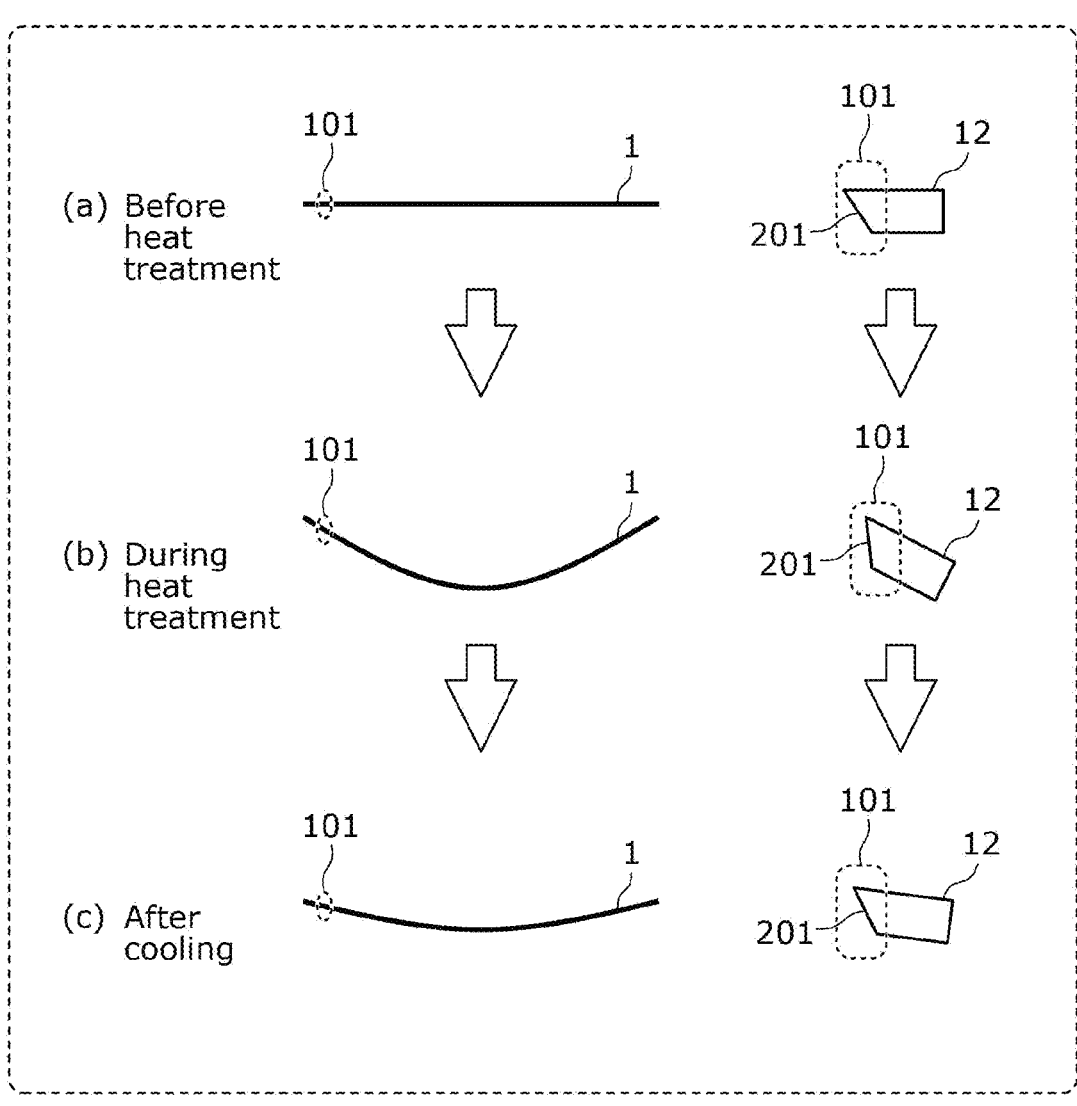
FIG. 7 includes cross sectional views of the semiconductor device and the first perimeter structure according to Embodiment 1, which schematically illustrate examples of a state in which the semiconductor device according to Embodiment 1 deforms in a heat treatment process.

FIG. 7 includes cross sectional views of semiconductor device 1 and first perimeter structure 101, which schematically illustrate examples of a state in which semiconductor device 1 deforms in a heat treatment process at the time of resin encapsulation when semiconductor device 1 is faceup mounted being encapsulated in resin in the mounting substrate.

As described above, semiconductor device 1 includes, on the back surface side, metal layer 30 having a thickness greater than the greatest thickness of first wiring electrode 12, the greatest thickness of second wiring electrode 52, the greatest thickness of third wiring electrode 22, and the greatest thickness of fourth wiring electrode 54. Normally, metal included in metal layer 30 (for example, silver, copper, nickel, or an alloy of one or more of the metals) has thermal expansion coefficient greater than thermal expansion coefficient of an impurity-containing semiconductor (for example, silicon doped with impurities) included in semiconductor layer 40.

Accordingly, as illustrated in (b) of FIG. 7, the temperature of semiconductor device 1 is increased during heat treatment for curing resin which is performed when encapsulating semiconductor device 1 in resin in the mounting substrate, and thus semiconductor device 1 warps with the back surface protruding. Accordingly, the tilt of first wall surface 201 in a reverse tapered shape of first perimeter structure 101 is changed to an upper side of semiconductor device 1 during the heat treatment as compared with the tilt before the heat treatment, as illustrated in (a) and (b) of FIG. 7.

After that, when the heat treatment ends, and the temperatures of the resin and semiconductor device 1 are decreased (and return to the normal temperatures), the warpage of semiconductor device 1 with the back surface protruding is reduced as illustrated in (c) of FIG. 7. Accordingly, the tilt of first wall surface 201 in a reverse tapered shape of first perimeter structure 101 is changed to a lower side of semiconductor device 1 after the temperatures are decreased, as compared with the tilt during the heat treatment, as illustrated in (b) and (c) of FIG. 7.

As described above, the tilt of first wall surface 201 in a reverse tapered shape, which is included in first perimeter structure 101, is changed from the upper side to the lower side of semiconductor device 1 after the heat treatment ends and while the temperatures of the resin and semiconductor device 1 are decreased, along with a reduction in warpage of semiconductor device 1. With this change, first perimeter structure 101 more firmly digs in the resin than the configuration that does not include first wall surface 201 in a reverse tapered shape.

Thus, according to semiconductor device 1 having the above configuration, since first perimeter structure 101 includes first wall surface 201 in a reverse tapered shape, first perimeter structure 101 plays a role as an anchor that more firmly fixes the position of semiconductor device 1 in the resin than a configuration that does not include first wall surface 201. As a result, resin is further prevented from coming off in the mounting substrate and the position of semiconductor device 1 in the mounting substrate is more stabilized.

For similar reasons, according to semiconductor device 1 having the above configuration, since second perimeter structure 102 includes the second wall surface in a reverse tapered shape, second perimeter structure 102 plays a role as an anchor that more firmly fixes the position of semiconductor device 1 in the resin than a configuration that does not include the second wall surface. As a result, resin is further prevented from coming off in the mounting substrate and the position of semiconductor device 1 in the mounting substrate is more stabilized.

Furthermore, as described above, in the plan view of semiconductor layer 40, first wall surface 201 is located within first tapered region 202.

Accordingly, according to semiconductor device 1 having the above configuration, first perimeter structure 101 more firmly digs in the resin than a configuration in which first wall surface 201 is not located within first tapered region 202.

Thus, according to semiconductor device 1 having the above configuration, since first wall surface 201 is located within first tapered region 202 in the plan view of semiconductor layer 40, first perimeter structure 101 plays a role as an anchor that more firmly fixes the position of semiconductor device 1 in the resin than a configuration in which first wall surface 201 is not located within first tapered region 202 in the plan view of semiconductor layer 40. As a result, resin is further prevented from coming off in the mounting substrate and the position of semiconductor device 1 in the mounting substrate is more stabilized.

For similar reasons, according to semiconductor device 1 having the above configuration, since the second wall surface is located within the second tapered region in the plan view of semiconductor layer 40, second perimeter structure 102 plays a role as an anchor that more firmly fixes the position of semiconductor device 1 in the resin than a configuration in which the second wall surface is not located within the second tapered region in the plan view of semiconductor layer 40. As a result, resin is further prevented from coming off in the mounting substrate and the position of semiconductor device 1 in the mounting substrate is more stabilized.

By the way, first wall surface 201 and the second wall surface in a reverse tapered shape may have a reverse tapered shape entirely along the perimeters of first wiring electrode 12 and second wiring electrode 52 in the plan view of semiconductor layer 40, but only portions of first wall surface 201 and the second wall surface may be in a reverse tapered shape along the perimeters.

When only portions of first wall surface 201 and the second wall surface are in a reverse tapered shape along the perimeters, the reverse tapered shape may be provided in a portion that conforms to a direction in which the warpage of semiconductor device 1 is the greatest. For example, in the plan view of semiconductor layer 40, when semiconductor device 1 is a rectangle having a longer direction, the warpage in the longer direction is the greatest, and thus first wall surface 201 and the second wall surface may be in a reverse tapered shape in portions that include positions orthogonal to the longer direction of semiconductor device 1.

Figures 8, 9:
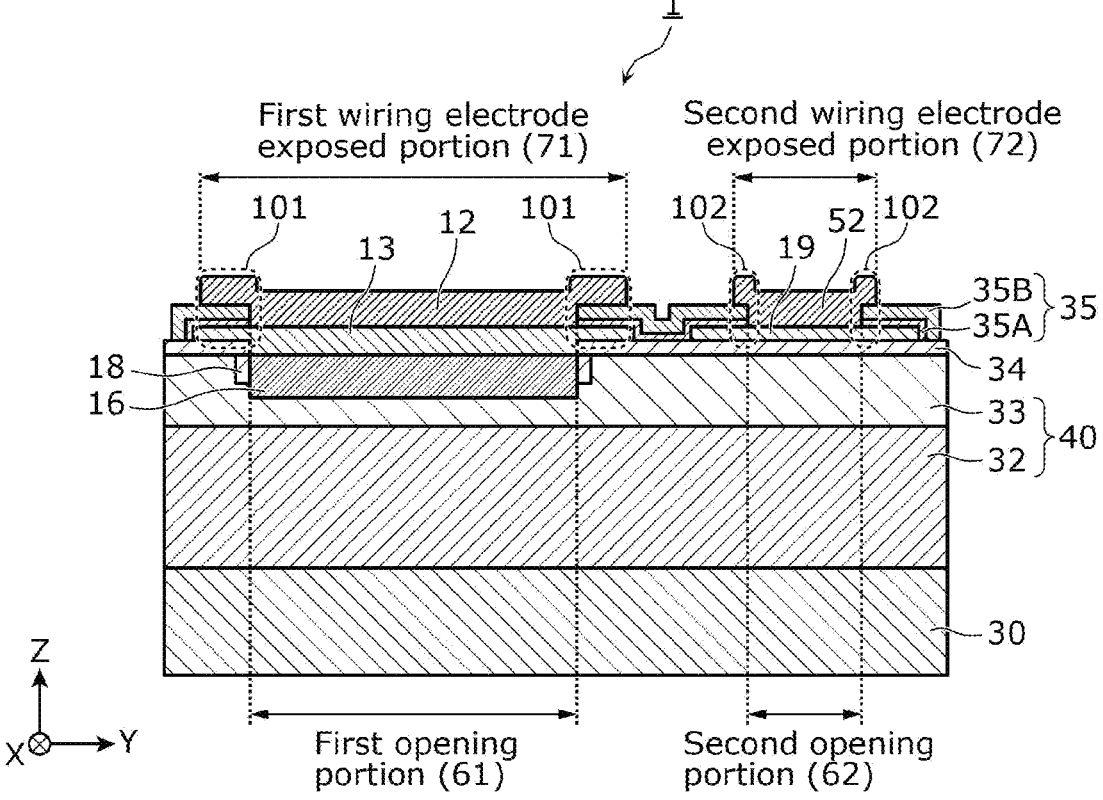
FIG. 8 is a plan view illustrating an example of a structure of the semiconductor device according to Embodiment 1.
FIG. 9 is a cross sectional view illustrating an example of a structure of the semiconductor device according to Embodiment 1.

FIG. 8 is a plan view of semiconductor device 1 in a case (hereinafter, also referred to as "first case") in which an occupancy ratio expressed by S1/M1 is greater than or equal to 0.5 and less than 1.0, the occupancy ratio being an occupancy ratio at which the area of first opening portion 61 occupies the area of first source electrode 13 when the area of first source electrode 13 is denoted by M1, the area of first opening portion 61 is denoted by S1, and the area of first wiring electrode exposed portion 71 is denoted by P1 in the plan view of semiconductor layer 40. Note that although first wiring electrode exposed portion 71 is not illustrated in FIG. 8 or FIG. 10 described later, area P1 of first wiring electrode exposed portion 71 in the plan view of semiconductor layer 40 is the same as the area of first wiring electrode 12 in FIG. 8 and FIG. 10 described later.

FIG. 9 is a cross sectional view of semiconductor device 1 in the first case and illustrates a cut surface along III-III in FIG. 8.

Figure 10:
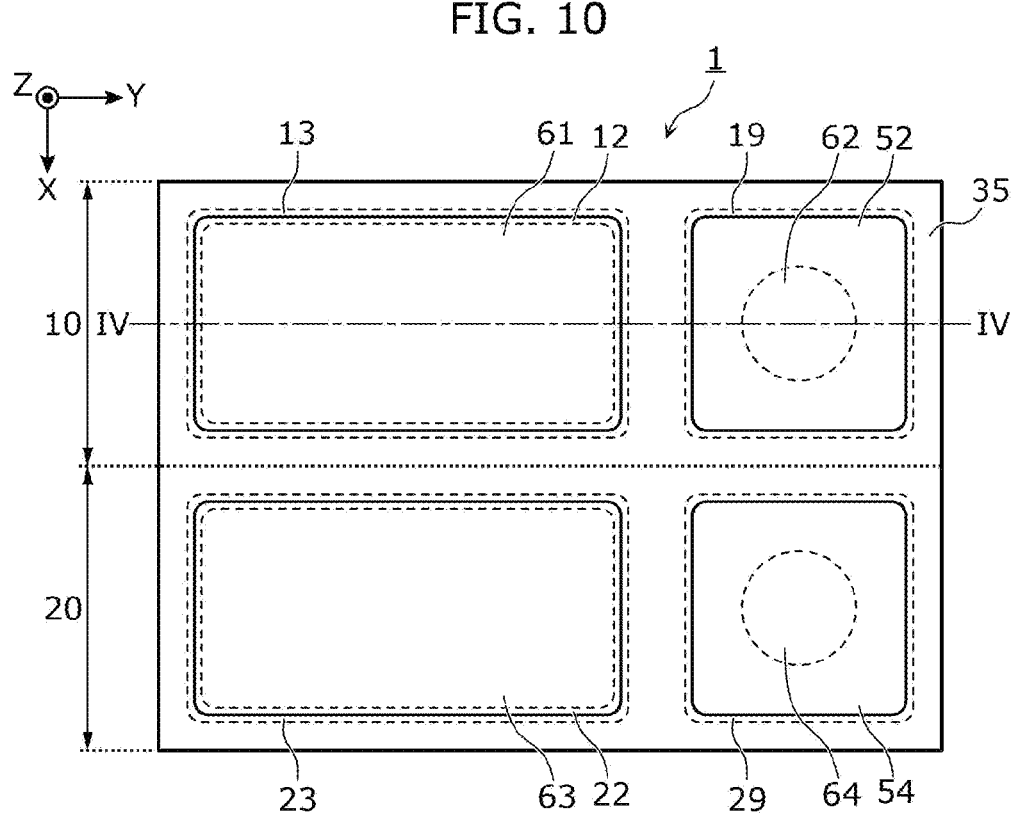
FIG. 10 is a plan view illustrating an example of a structure of the semiconductor device according to Embodiment 1.

FIG. 10 is a plan view of semiconductor device 1 in a case (hereinafter, also referred to as "second case") in which an occupancy ratio that is expressed by S1/M1 and at which the area of first opening portion 61 occupies the area of first source electrode 13 is greater than or equal to 0.9 and less than 1.0, and an occupancy ratio that is expressed by P1/M1 and at which the area of first wiring electrode exposed portion 71 occupies the area of first source electrode 13 is greater than or equal to 0.5.

Figure 11:
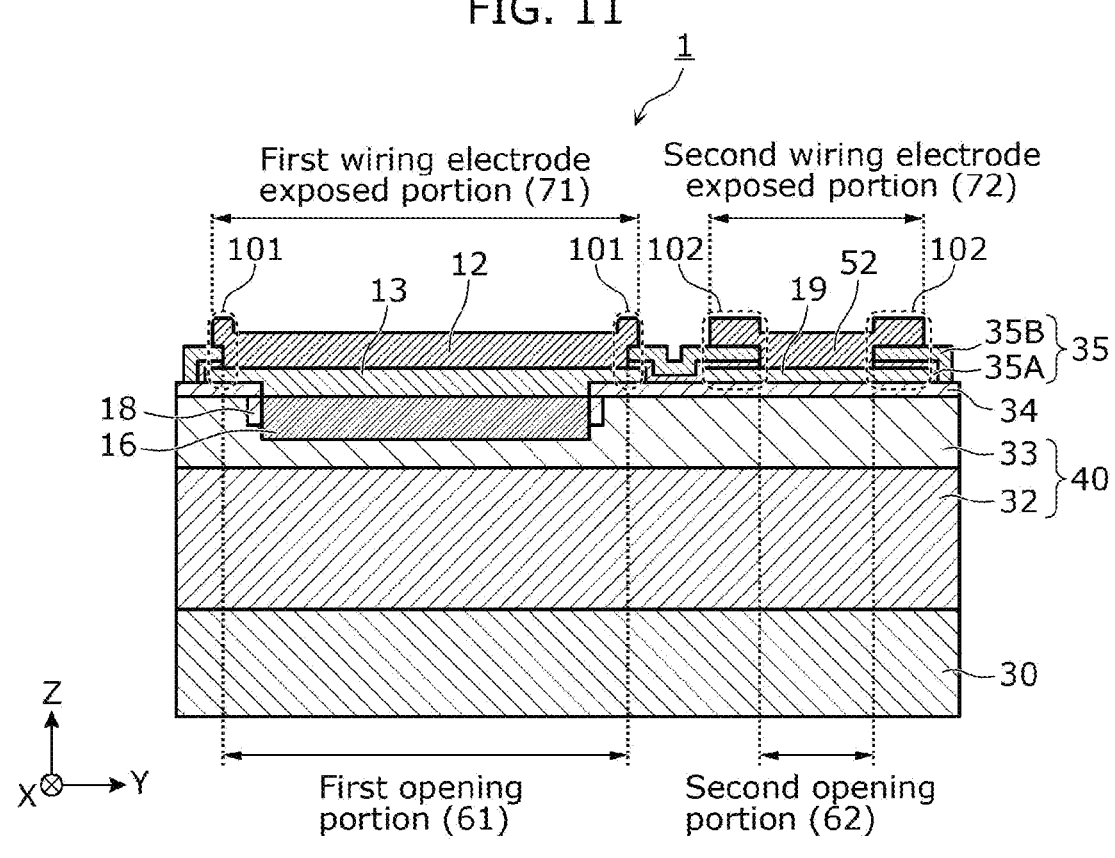
FIG. 11 is a cross sectional view illustrating an example of a structure of the semiconductor device according to Embodiment 1.

FIG. 11 is a cross sectional view of semiconductor device 1 in the second case and illustrates a cut surface along IV-IV in FIG. 10.

Typically, in a semiconductor device that is facedown mounted using a bonding material such as solder, S1/M1 is less than 0.5 from the common-sense perspective, in order to prevent the occurrence of poor mounting due to, for instance, voids being made in the bonding material.

In this regard, semiconductor device 1 according to the present disclosure is faceup mounted without using a bonding material such as solder, and thus there is no need to worry about the occurrence of poor mounting due to, for instance, voids being made in the bonding material. Accordingly, from viewpoints of reducing the on resistance of semiconductor device 1 and improving the heat dissipation property of semiconductor device 1, in semiconductor device 1, S1/M1 may be greater than or equal to 0.5, or stated differently, S1/M1 may be greater than or equal to 0.5 and less than 1.0, as shown in the examples illustrated in FIG. 8 and FIG. 9.

A reason why S1/M1 may be less than 1.0 is that in the plan view of semiconductor layer 40, if area S1 of first opening portion 61 is larger than area M1 of first source electrode 13, a region of oxide film 34 that is not covered with first source electrode 13 is made open by first opening portion 61.

Moreover, from viewpoints of reducing the on resistance of semiconductor device 1 and improving the heat dissipation property of semiconductor device 1, as shown in the examples illustrated in FIG. 10 and FIG. 11, S1/M1 may be greater than or equal to 0.9 and less than 1.0 and P1/M1 may be greater than or equal to 0.9 and less than 1.1, in semiconductor device 1. This is intended to increase the exposure of first source electrode 13 to the outside as much as possible, in order to reduce the on resistance of semiconductor device 1 and improving the heat dissipation property of semiconductor device 1.

Note that in the examples illustrated in FIG. 10 and FIG. 11, in the plan view of semiconductor layer 40, when the area of first gate electrode 19 is denoted by M2, the area of second opening portion 62 is denoted by S2, and the area of second wiring electrode exposed portion 72 is denoted by P2, an occupancy ratio at which the area of second wiring electrode exposed portion 72 occupies the area of first gate electrode 19 is greater than or equal to 0.9 and less than 1.1.

As shown in the examples illustrated in FIG. 10 and FIG. 11, it is effective that the occupancy ratio that is expressed by P2/M2 and at which the area of second wiring electrode exposed portion 72 occupies the area of first gate electrode 19 is greater than or equal to 0.9 and less than or equal to 1.1.

In order to favorably connect second wiring electrode exposed portion 72 to an external wiring provided outside semiconductor device 1 through a hole made in the resin with which semiconductor device 1 is encapsulated, area P2 of second wiring electrode exposed portion 72 in the plan view of semiconductor layer 40 may be larger than area S2 of second opening portion 62 in the plan view of semiconductor layer 40.

Generally, there are many cases in which second opening portion 62 is circular in the plan view of semiconductor layer 40. In contrast, semiconductor device 1 is rectangular in the plan view of semiconductor layer 40, as described above.

Accordingly, when P2 is made greater than S2, second wiring electrode exposed portion 72 may be rectangular in the plan view of semiconductor layer 40. In this case, in the plan view of semiconductor layer 40, the shape of rectangular second wiring electrode exposed portion 72 that is larger than S2 is a square circumscribed about circular second opening portion 62. Here, a square circumscribed about a circle has an area 1.27 times the area of the circle.

It can be said from these that an occupancy ratio which is expressed by P2/S2 and at which the area of second wiring electrode exposed portion 72 occupies the area of second opening portion 62 may be greater than or equal to 1.27.

In order to favorably connect first wiring electrode exposed portion 71 to an external wiring provided outside semiconductor device 1 through a hole made in the resin with which semiconductor device 1 is encapsulated and favorably connect second wiring electrode exposed portion 72 to an external wiring provided outside semiconductor device 1 through a hole made in the resin with which semiconductor device 1 is encapsulated, in the plan view of semiconductor layer 40, the area of first wiring electrode 12 and the area of second wiring electrode 52 may be as large as possible and the shape of first wiring electrode 12 and the shape of second wiring electrode 52 may be the same.

Figure 12:
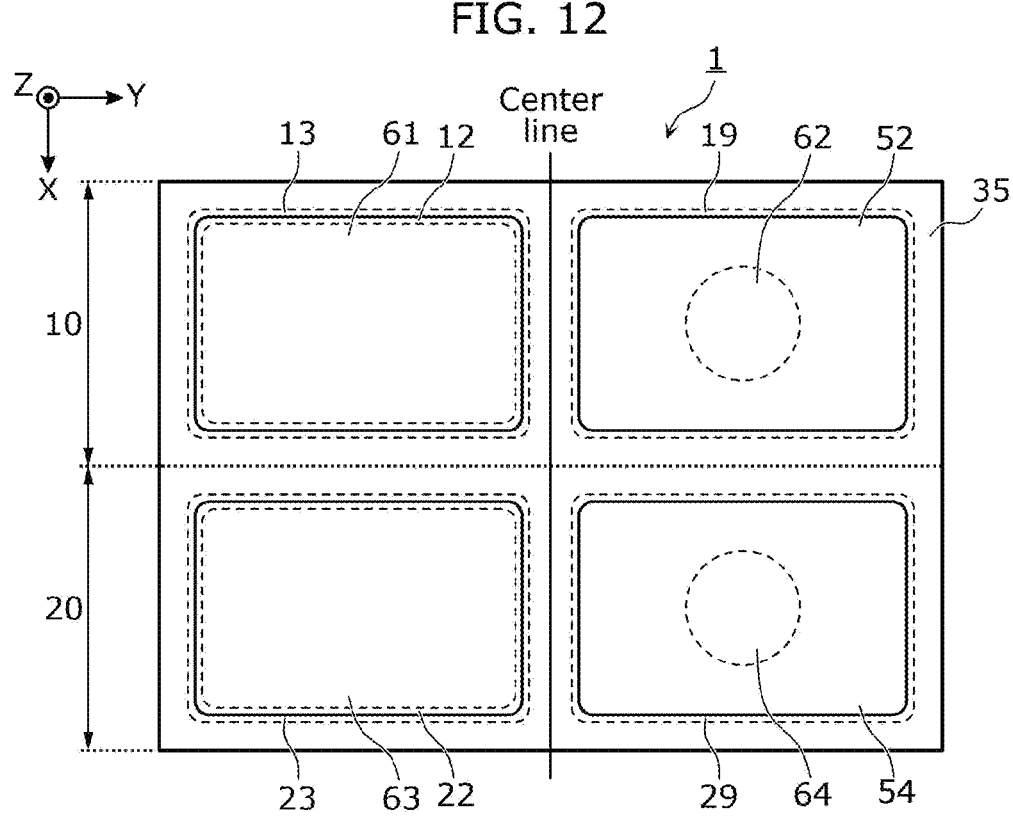
FIG. 12 is a plan view illustrating an example of a structure of the semiconductor device according to Embodiment 1.

FIG. 12 is a plan view illustrating an example of a structure of semiconductor device 1 that includes first wiring electrode 12 and second wiring electrode 52 that are in the shapes as described above.

As illustrated in FIG. 12, semiconductor device 1 may have such a shape as described above by being shaped such that in the plan view of semiconductor layer 40, the shape of first wiring electrode 12 and the shape of second wiring electrode 52 are axisymmetric with respect to the center line as an axis of symmetry and the center line bisects the area of semiconductor device 1.

Embodiment 2

In the following, a description is given on a semiconductor device according to Embodiment 2 that is configured by changing, from semiconductor device 1 according to Embodiment 1, first perimeter structure 101 to a first perimeter structure according to Embodiment 2 and second perimeter structure 102 to a second perimeter structure according to Embodiment 2.

Here, the semiconductor device according to Embodiment 2 is to be described mainly focusing on differences from semiconductor device 1 while equivalent elements to those of semiconductor device 1 are assumed to be already described and thus are given the same reference signs and detailed description thereof is omitted.

Note that a description has been given in Embodiment 1 that protective film 35 included in semiconductor device 1 may be a single-layer structure or a multi-layer structure, but nevertheless, in Embodiment 2, protective film 35 included in the semiconductor device according to Embodiment 2 needs to be a multi-layer structure. Accordingly, a description is given in the following, assuming that protective film 35 included in the semiconductor device according to embodiment 2 is a multi-layer structure (here, a two-layer structure) in which first protective film layer 35A and second protective film layer 35B are stacked.

<Structure>

Figures 13, 14:
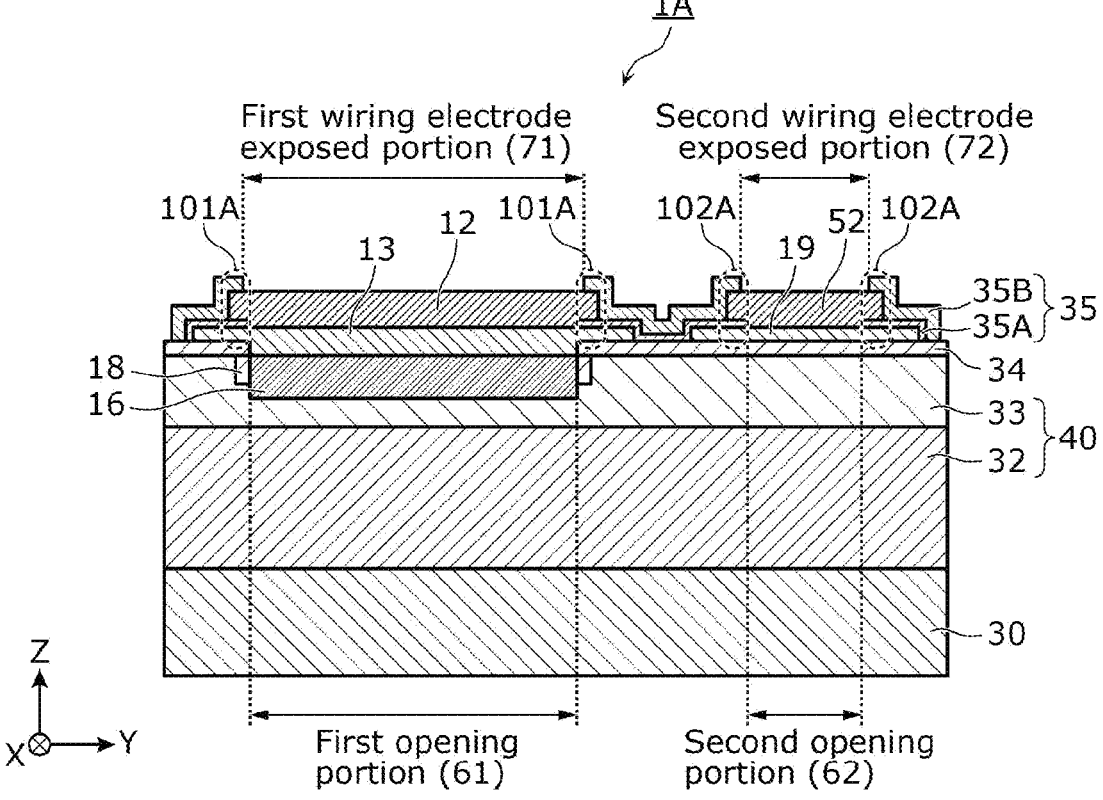
FIG. 13 is a plan view illustrating an example of a structure of a semiconductor device according to Embodiment 2.
FIG. 14 is a cross sectional view illustrating an example of a structure of the semiconductor device according to Embodiment 2.

FIG. 13 is a plan view illustrating an example of a structure of semiconductor device 1A according to Embodiment 2.

FIG. 14 is a cross sectional view illustrating an example of the structure of semiconductor device 1A. FIG. 14 illustrates a cut surface along V-V in FIG. 13.

As illustrated in FIG. 13 and FIG. 14, semiconductor device 1A is configured by changing, from semiconductor device 1 according to Embodiment 1, first perimeter structure 101 to first perimeter structure 101A according to Embodiment 2 and second perimeter structure 102 to second perimeter structure 102A according to Embodiment 2.

More specifically, as illustrated in FIG. 14, in semiconductor device 1A, first perimeter structure 101A in which first source electrode 13, first protective film layer 35A, first wiring electrode 12, and second protective film layer 35B are stacked in stated order is provided in a perimeter portion of first wiring electrode 12 in the plan view of semiconductor layer 40, and second perimeter structure 102A in which first gate electrode 19, first protective film layer 35A, second wiring electrode 52, and second protective film layer 35B are stacked in stated order is provided in a perimeter portion of second wiring electrode 52 in the plan view of semiconductor layer 40.

Here, the uppermost layer of first perimeter structure 101A is second protective film layer 35B, and the uppermost layer of second perimeter structure 102A is second protective film layer 35B.

Along with the above changes, in semiconductor device 1 according to Embodiment 1, the entire upper surface of first wiring electrode 12 is exposed to the outside of semiconductor device 1 and the entire upper surface of second wiring electrode 52 is exposed to the outside of semiconductor device 1, whereas in semiconductor device 1A, a portion of the upper surface of first wiring electrode 12 that is not included in first perimeter structure 101A is exposed to the outside of semiconductor device 1A and a portion of the upper surface of second wiring electrode 52 that is not included in second perimeter structure 102A is exposed to the outside of semiconductor device 1A.

As described above, in the present disclosure, the portion of the upper surface of first wiring electrode 12 which is exposed to the outside of semiconductor device 1A is defined as first wiring electrode exposed portion 71, whereas the portion of the upper surface of second wiring electrode 52 which is exposed to the outside of semiconductor device 1A is defined as second wiring electrode exposed portion 72.

Accordingly, in Embodiment 2, first wiring electrode exposed portion 71 is the portion of the upper surface of first wiring electrode 12 that is not included in first perimeter structure 101A, and second wiring electrode exposed portion 72 is the portion of the upper surface of second wiring electrode 52 that is not included in second perimeter structure 102A.

Accordingly, in Embodiment 2, first wiring electrode exposed portion 71 that is the portion of the upper surface of first wiring electrode 12 that is not included in first perimeter structure 101A is exposed to the outside of semiconductor device 1A, and second wiring electrode exposed portion 72 that is the portion of the upper surface of second wiring electrode 52 that is not included in second perimeter structure 102A is exposed to the outside of semiconductor device 1A.

Note that also in semiconductor device 1A, similarly to semiconductor device 1 according to Embodiment 1, in the plan view of semiconductor layer 40, the area of first wiring electrode exposed portion 71 is larger than the area of first opening portion 61, and the area of second wiring electrode exposed portion 72 is larger than the area of second opening portion 62.

As illustrated in FIG. 14, first perimeter structure 101A protrudes above the upper surface of first wiring electrode exposed portion 71, second perimeter structure 102A protrudes above the upper surface of second wiring electrode exposed portion 72, and the highest position of semiconductor device 1A is located in at least one of first perimeter structure 101A or second perimeter structure 102A.

Here, in order that first perimeter structure 101A protrudes above the upper surface of first wiring electrode exposed portion 71, when the thickness of first wiring electrode 12 in first perimeter structure 101A is a first thickness and the thickness of second protective film layer 35B in first perimeter structure 101A is a second thickness, the second thickness may be less than or equal to the first thickness.

This is because if the second thickness is greater than the first thickness, second protective film 35B will uniformly cover first wiring electrode 12, which makes it difficult to provide first perimeter structure 101A.

The greater the second thickness is than the first thickness, the stronger the tendency for second protective film 35B to uniformly cover first wiring electrode 12 becomes. For this reason, the second thickness may be at least less than or equal to the first thickness.

Similarly, in order that second perimeter structure 102A protrudes above the upper surface of second wiring electrode exposed portion 72, when the thickness of second wiring electrode 52 in second perimeter structure 102A is a third thickness and the thickness of second protective film layer 35B in second perimeter structure 102A is a fourth thickness, the fourth thickness may be less than or equal to the third thickness.

On the other hand, the inventors repeatedly conducted experiments and examinations on the height of first perimeter structure 101A from the upper surface of first wiring electrode exposed portion 71 as a reference and the height of second perimeter structure 102A from the upper surface of second wiring electrode exposed portion 72 as a reference, which need for first perimeter structure and second perimeter structure to dig in resin when semiconductor device 1A is faceup mounted being encapsulated in the resin in a mounting substrate. As a result, the inventors found that first perimeter structure 101A and second perimeter structure 102A can be caused to sufficiently dig in the resin when the height of first perimeter structure 101A from the upper surface of first wiring electrode exposed portion 71 as a reference is 50% of the thickness of first wiring electrode 12 in first opening portion 61 and the height of second perimeter structure 102A from the upper surface of second wiring electrode exposed portion 72 as a reference is 50% of the thickness of second wiring electrode 52 in second opening portion 62.

Here, first perimeter structure 101A and second perimeter structure 102A being caused to sufficiently dig in resin means first perimeter structure 101A and second perimeter structure 102A digging in resin so as to play roles as anchors that fix the position of semiconductor device 1A in the resin.

Thus, the inventors have found through the experiments and examinations that in order to cause first perimeter structure 101A to more firmly dig in resin, it is effective in stably yielding a strong anchor effect when the digging amount is at least 10% of the thickness of the resin.

As will be described later, the thickness of first wiring electrode 12 needs to have a sufficient margin in a process of making a hole in resin by, for instance, a laser process performed later, and thus the thickness of first wiring electrode 12 needs to be greater than or equal to approximately one third of the thickness of the resin that fills the space directly above.

Hence, a favorable digging amount (the height of first perimeter structure 101A from the upper surface of first wiring electrode exposed portion 71 as a reference and the height of second perimeter structure 102A from the upper surface of second wiring electrode exposed portion 72 as a reference) is at least greater than or equal to 30% of the thickness of first wiring electrode 12, but is determined to be greater than or equal to 50% of the thickness of first wiring electrode 12 in the present disclosure in order to further stably yield a strong anchor effect.

Furthermore, the inventors found that protrusions that reflect first perimeter structure 101A and second perimeter structure 102A are provided on the upper surface of the resin that has solidified after encapsulating semiconductor device 1A when the height of first perimeter structure 101A from the upper surface of first wiring electrode exposed portion 71 as a reference is 50% of the thickness of first wiring electrode 12 in first opening portion 61 and the height of second perimeter structure 102A from the upper surface of second wiring electrode exposed portion 72 as a reference is 50% of the thickness of second wiring electrode 52 in second opening portion 62.

Accordingly, the inventors determined for semiconductor device 1A that the second thickness is greater than half the first thickness and less than or equal to the first thickness, and the fourth thickness is greater than half the third thickness and less than or equal to the third thickness.

By the way, second protective film layer 35B is provided normally using viscous polyimide. Accordingly, when second protective film layer 35B is to be provided on a portion having a stepped structure such as first perimeter structure 101A and second perimeter structure 102A, polyimide on the upper side of the step flows down to the lower side of the step, so that second protective film layer 35B in an expected shape may not be provided.

Accordingly, the inventors repeatedly conducted experiments and examinations on the shape of second protective film layer 35B and the shapes of first perimeter structure 101A and second perimeter structure 102A that can prevent polyimide on the upper side of the step from flowing down to the lower side of the step, in providing first perimeter structure 101A and second perimeter structure 102A. As a result, the inventors found that polyimide on the upper side of the step can be prevented from flowing down to the lower side of the step in providing first perimeter structure 101A when a smallest width of a portion of second protective film layer 35B that overlaps first wiring electrode 12 in the plan view of semiconductor layer 40 is greater than the thickness of a portion of second protective film layer 35B that does not overlap first wiring electrode 12 or second wiring electrode 52 in the plan view of semiconductor layer 40, and found that polyimide on the upper side of the step can be prevented from flowing down to the lower side of the step in providing second perimeter structure 102A when a smallest width of a portion of second protective film layer 35B that overlaps second wiring electrode 52 in the plan view of semiconductor layer 40 is greater than the thickness of a portion of second protective film layer 35B that does not overlap first wiring electrode 12 or second wiring electrode 52 in the plan view of semiconductor layer 40.

Accordingly, the inventors determined for semiconductor device 1A that a smallest width of a portion of second protective film layer 35B that overlaps first wiring electrode 12 in the plan view of semiconductor layer 40 is greater than the thickness of a portion of second protective film layer 35B that does not overlap first wiring electrode 12 or second wiring electrode 52 in the plan view of semiconductor layer 40, and a smallest width of a portion of second protective film layer 35B that overlaps second wiring electrode 52 in the plan view of semiconductor layer 40 is greater than the thickness of a portion of second protective film layer 35B that does not overlap first wiring electrode 12 or second wiring electrode 52 in the plan view of semiconductor layer 40.

<Consideration>

According to semiconductor device 1A having the above configuration, when such semiconductor device 1A is faceup mounted being encapsulated in resin in the mounting substrate, first perimeter structure 101A and second perimeter structure 102A dig in the resin at the upper surface of semiconductor device 1A, similarly to the case of semiconductor device 1 according to Embodiment 1.

Accordingly, first perimeter structure 101A and second perimeter structure 102A digging in the resin play roles as anchors that fix the position of semiconductor device 1A in the resin, and as a result, resin can be prevented from coming off in the mounting substrate and the position of semiconductor device 1A in the mounting substrate can be stabilized.

Similarly to the case of semiconductor device 1 according to Embodiment 1, protrusions that reflect first perimeter structure 101A and second perimeter structure 102A are provided on the upper surface of the resin that has solidified after encapsulating semiconductor device 1A.

Accordingly, when a process of making, in the resin, a hole that reaches first wiring electrode exposed portion 71 from the upper surface of the resin is performed, a protrusion corresponding to first perimeter structure 101A and provided on the upper surface of the resin is used as a guideline and a process of making a hole on the inner side of the protrusion is performed, whereby the process of making a hole that reaches first wiring electrode exposed portion 71 from the upper surface of the resin can be performed more accurately than the case in which such a protrusion is not present.

Furthermore, similarly, when a process of making, in the resin, a hole that reaches second wiring electrode exposed portion 72 from the upper surface of the resin is performed, a protrusion corresponding to second perimeter structure 102A and provided on the upper surface of the resin is used as a guideline and a process of making a hole on the inner side of the protrusion is performed, whereby the process of making a hole that reaches second wiring electrode exposed portion 72 from the upper surface of the resin can be performed more accurately than the case in which such a protrusion is not present.

As described above, according to semiconductor device 1A having the above configuration, a semiconductor device having a structure suitable for a mounting method with which the semiconductor device is mounted being embedded in a mounting substrate is provided, similarly to the case of semiconductor device 1 according to Embodiment 1.

As described above, in the plan view of semiconductor layer 40, the area of first wiring electrode exposed portion 71 is larger than the area of first opening portion 61, and the area of second wiring electrode exposed portion 72 is larger than the area of second opening portion 62.

Accordingly, similarly to the case of semiconductor device 1 according to Embodiment 1, the degree of freedom of the processes of making a hole that reaches first wiring electrode exposed portion 71 from the upper surface of the resin and making a hole that reaches second wiring electrode exposed portion 72 from the upper surface of the resin can be increased as compared with the case in which in the plan view of semiconductor layer 40, the area of first wiring electrode exposed portion 71 is not larger than the area of first opening portion 61 and the area of second wiring electrode exposed portion 72 is not larger than the area of second opening portion 62.

Similarly to the case of semiconductor device 1 according to Embodiment 1, S1/M1 may be greater than or equal to 0.5, or stated differently, S1/M1 may be greater than or equal to 0.5 and less than 1.0, and furthermore, in semiconductor device 1A, S1/M1 may be greater than or equal to 0.9 and less than 1.0 and P1/M1 may be greater than or equal to 0.9 and less than or equal to 1.1.

Similarly to the case of semiconductor device 1 according to Embodiment 1, it is effective that P2/M2 is greater than or equal to 0.9 and less than or equal to 1.1 in semiconductor device 1A.

Similarly to the case of semiconductor device 1 according to Embodiment 1, it can be said that P2/S2 may be greater than or equal to 1.27 in semiconductor device 1A.

Similarly to the case of semiconductor device 1 according to Embodiment 1, by making the shape of semiconductor device 1A such that, in the plan view of semiconductor layer 40, the shape of first wiring electrode 12 and the shape of second wiring electrode 52 axisymmetric with respect to the center line as an axis of symmetry and the center line bisects the area of semiconductor device 1A, semiconductor device 1A may be shaped to favorably connect first wiring electrode exposed portion 71 to an external wiring provided outside semiconductor device 1A through a hole made in the resin that encapsulates semiconductor device 1A and favorably connect second wiring electrode exposed portion 72 to an external wiring provided outside semiconductor device 1A through a hole made in the resin that encapsulates semiconductor device 1A.

Note that in Embodiment 2, protective film 35 has been described as having a two-layer structure in which two layers such as first protective film layer 35A and second protective film layer 35B are stacked, but nevertheless protective film layer 35 may have a multi-layer structure in which three or more layers are stacked.

Figure 15:
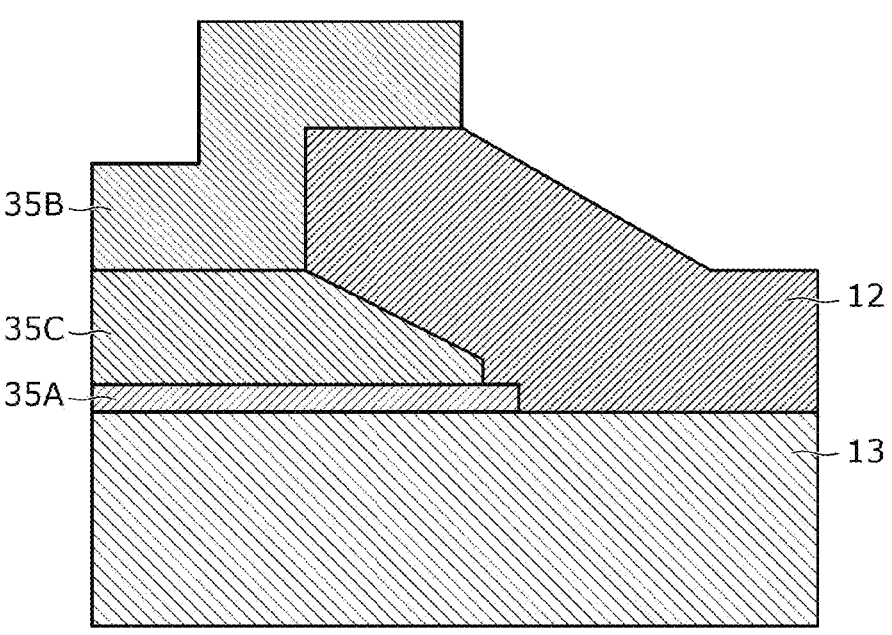
FIG. 15 is an enlarged cross-sectional view illustrating a structure of a first perimeter structure according to Embodiment 2.

FIG. 15 is an enlarged cross-sectional view illustrating an example of a structure of first perimeter structure 101A in a case in which protective film 35 has a three-layer structure.

As illustrated in FIG. 15, when protective film 35 has a three-layer structure, protective film 35 may be configured by further stacking third protective film layer 35C between first protective film layer 35A and second protective film layer 35B, in addition to first protective film layer 35A and second protective film layer 35B.

Note that attention needs to be given considering a possibility that the logic discussed in the <Consideration> item in Embodiment 2 may not be held true when the thicknesses of first wiring electrode 12 and second wiring electrode 52 are excessively thinner than 10 μm.

Embodiment 3

In the following, a description is given on a mounting substrate according to Embodiment 3 in which semiconductor device 1 according to Embodiment 1, semiconductor device 1A according to Embodiment 2, or a semiconductor device (hereinafter, also referred to as a "semiconductor device to be mounted") that includes first wiring electrode 12, second wiring electrode 52, and protective film 35 are configured similarly to those of semiconductor device 1 or semiconductor device 1A is faceup mounted in an interlayer insulating layer.

Here, with regard to the mounting substrate according to Embodiment 3, the elements of semiconductor device 1 are given the same signs and detailed description thereof is omitted, assuming that the elements have already been described.

Note that a description is given in Embodiment 3, assuming that the semiconductor device mounted in the mounting substrate according to Embodiment 3 is semiconductor device 1, but the same applies to the cases in which the semiconductor device mounted in the mounting substrate according to Embodiment 3 is semiconductor device 1A and is the semiconductor device to be mounted.

Figure 16:
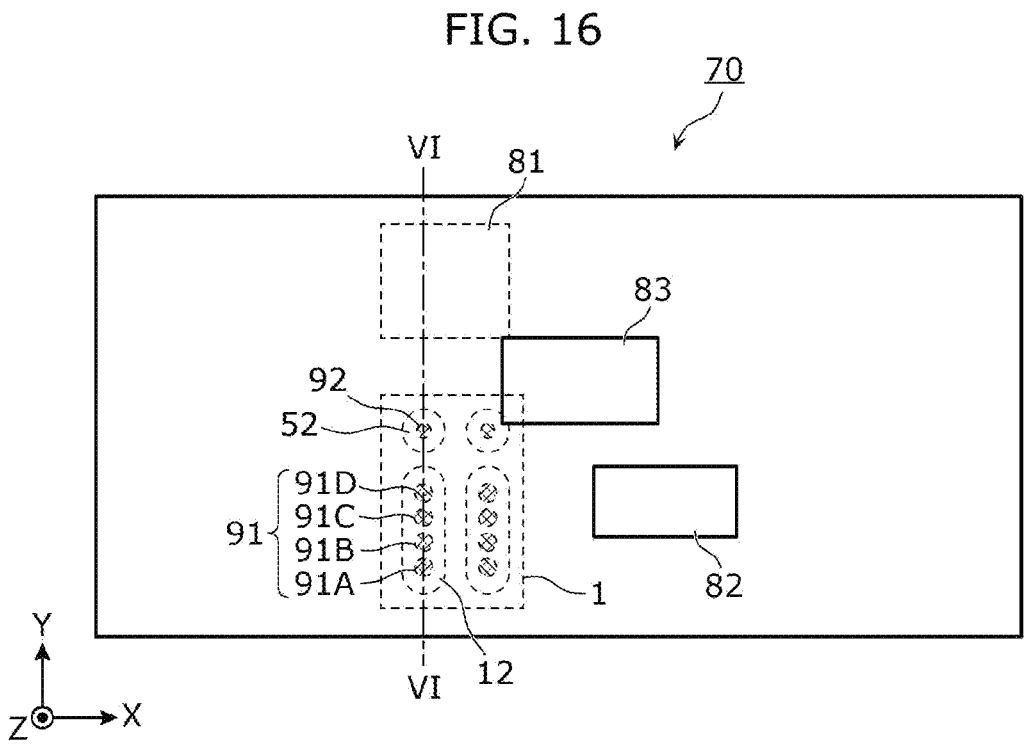
FIG. 16 is a plan view illustrating an example of a structure of a mounting substrate according to Embodiment 3.

FIG. 16 is a plan view illustrating an example of a structure of mounting substrate 70 according to Embodiment 3. As illustrated in FIG. 16, mounting substrate 70 is in a shape having a longer direction. Here, the X-axis direction in FIG. 16 is the longer direction of mounting substrate 70.

Figure 17:
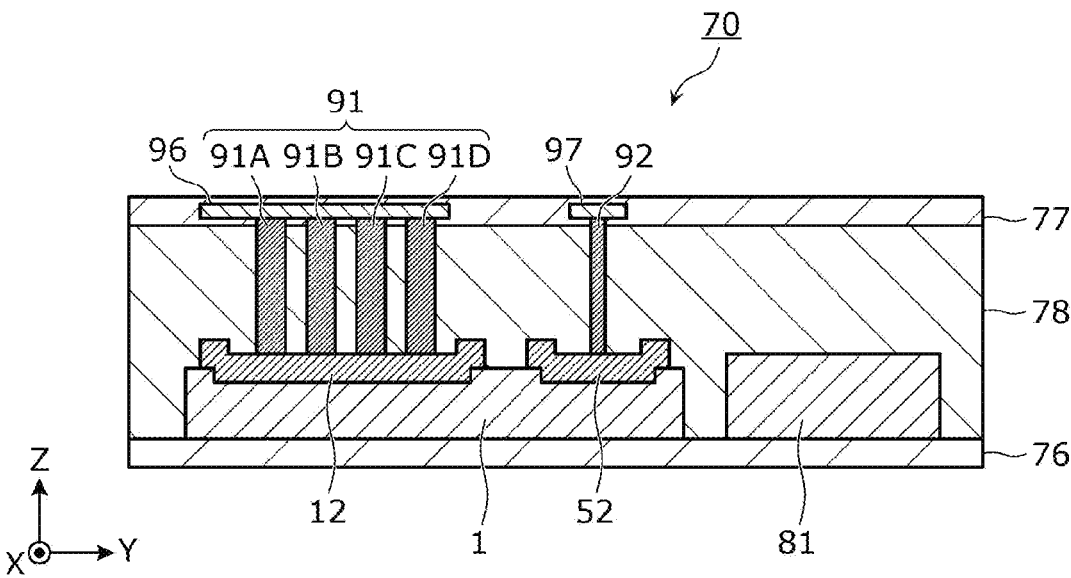
FIG. 17 is a cross sectional view illustrating an example of a structure of the mounting substrate according to Embodiment 3.

FIG. 17 is a cross sectional view illustrating an example of a structure of mounting substrate 70. FIG. 17 illustrates a cut surface along VI-VI in FIG. 16.

As illustrated in FIG. 16 and FIG. 17, mounting substrate 70 includes first wiring layer 76, interlayer insulating layer 78, and second wiring layer 77, and is configured by stacking first wiring layer 76, interlayer insulating layer 78, and second wiring layer 77 in stated order.

Note that a description is given herein that mounting substrate 70 includes two wiring layers that are first wiring layer 76 and second wiring layer 77 as the wiring layers, but the configuration of mounting substrate 70 is not limited to a configuration that includes two wiring layers that are first wiring layer 76 and second wiring layer 77.

As another example of a configuration, mounting substrate 70 may be configured to further include one or more wiring layers below first wiring layer 76 and/or above second wiring layer 77.

Mounting substrate 70 further includes semiconductor device 1, electronic component 81, one or more first connection wirings 91 (here, four first connection wirings 91 that are first connection wiring 91A to first connection wiring 91D in FIG. 16 and FIG. 17), and second connection wiring 92 in interlayer insulating layer 78, includes first wiring 96 and second wiring 97 in second wiring layer 77, and includes electronic component 82 and electronic component 83 above second wiring layer 77.

Here, a description is given assuming that semiconductor device 1 is in a rectangular shape having a longer direction and electronic component 83 is in a rectangular shape having a longer direction. Here, the Y-axis direction in FIG. 16 is the longer direction of semiconductor device 1, and the X-axis direction in FIG. 16 is the longer direction of electronic component 83.

Note that in FIG. 16, semiconductor device 1, electronic component 81, one or more first connection wirings 91, second connection wiring 92, first wiring electrode 12, and second wiring electrode 52 are illustrated by broken lines as if they are visible, but actually these elements cannot be directly viewed from the outside of mounting substrate 70.

Each of first wiring layer 76 and second wiring layer 77 is a layer for providing a wiring for electrically connecting components mounted in mounting substrate 70 and/or electrically connecting external components provided outside mounting substrate 70.

Interlayer insulating layer 78 is an insulating layer between first wiring layer 76 and second wiring layer 77. Here, interlayer insulating layer 78 is described as comprising resin.

Semiconductor device 1 is faceup mounted in interlayer insulating layer 78. At this time, semiconductor device 1 is mounted in an orientation in which the longer direction of semiconductor device 1 (here, the Y-axis direction in FIG. 16) and the longer direction of mounting substrate 70 (here, the X-axis direction in FIG. 16) are orthogonal to each other in the plan view of mounting substrate 70.

Electronic component 81 is mounted in interlayer insulating layer 78, and electronic component 82 is mounted above second wiring layer 77.

Electronic component 83 is mounted above second wiring layer 77. At this time, electronic component 83 is mounted in an orientation in which at least a portion of electronic component 83 overlaps semiconductor device 1 and the longer direction of electronic component 83 (here, the X-axis direction in FIG. 16) and the longer direction of semiconductor device 1 (here, the Y-axis direction in FIG. 16) are orthogonal to each other in the plan view of mounting substrate 70.

First wiring 96 is provided in second wiring layer 77 and comprises copper, silver, or an alloy of one or both of the metals, for example.

Second wiring 97 is provided in second wiring layer 77 and comprises copper, silver, or an alloy of one or both of the metals, for example.

Each of one or more first connection wirings 91 connects first wiring 96 and the upper surface of first wiring electrode 12 of semiconductor device 1, extends in a direction (here, the Z-axis direction in FIG. 16 and FIG. 17) orthogonal to mounting substrate 70, and comprises copper.

Each of one or more first connection wirings 91 is connected to the upper surface of first wiring electrode 12 in a portion of first wiring electrode 12 that does not overlap first perimeter structure 101 in the plan view of semiconductor layer 40.

One or more first connection wirings 91 are provided by making holes in interlayer insulating layer 78 by, for example, a laser process from the upper surface of interlayer insulating layer 78 to reach the upper surface of first wiring electrode 12 and filling the holes with copper, after semiconductor device 1 is faceup mounted in interlayer insulating layer 78, for example.

One or more first connection wirings 91 each have a circular cross section orthogonal to the direction in which one or more first connection wirings extend.

Note that here, one or more first connection wirings 91 are described as four wirings that are first connection wiring 91A to first connection wiring 91D, but are not limited to four wirings. One or more first connection wirings 91 may be one wiring or may be a plurality of wirings other than four wirings.

When one or more first connection wirings 91 are a plurality of wirings, even if one of the plurality of first connection wirings 91 is broken, other one or more first connection wirings 91 can maintain connection between first wiring electrode 12 and first wiring 96.

When one or more first connection wirings 91 are a plurality of wirings, as compared with the case in which one first connection wiring 91 is provided, the resistance values of first connection wirings 91 can be decreased and heat can be more efficiently dissipated via first connection wirings 91.

Second connection wiring 92 connects second wiring 97 and the upper surface of second wiring electrode 52 of semiconductor device 1, extends in a direction (the Z-axis direction in FIG. 16 and FIG. 17) orthogonal to mounting substrate 70, and comprises copper.

Second connection wiring 92 is connected to the upper surface of second wiring electrode 52 in a portion of second wiring electrode 52 that does not overlap second perimeter structure 102 in the plan view of semiconductor layer 40.

Second connection wiring 92 is provided by, for example, making a hole in interlayer insulating layer 78 by a laser process from the upper surface of interlayer insulating layer 78 to reach the upper surface of second wiring electrode 52 and filling the hole with copper, after semiconductor device 1 is faceup mounted in interlayer insulating layer 78, for example.

Note that at least one of one or more first connection wirings 91 may have a cross section larger than the cross section of second connection wiring 92 described later. This is because current flowing through first source electrode 13 is greater than current flowing through first gate electrode 19 in first vertical MOS transistor 10.

Figure 18:
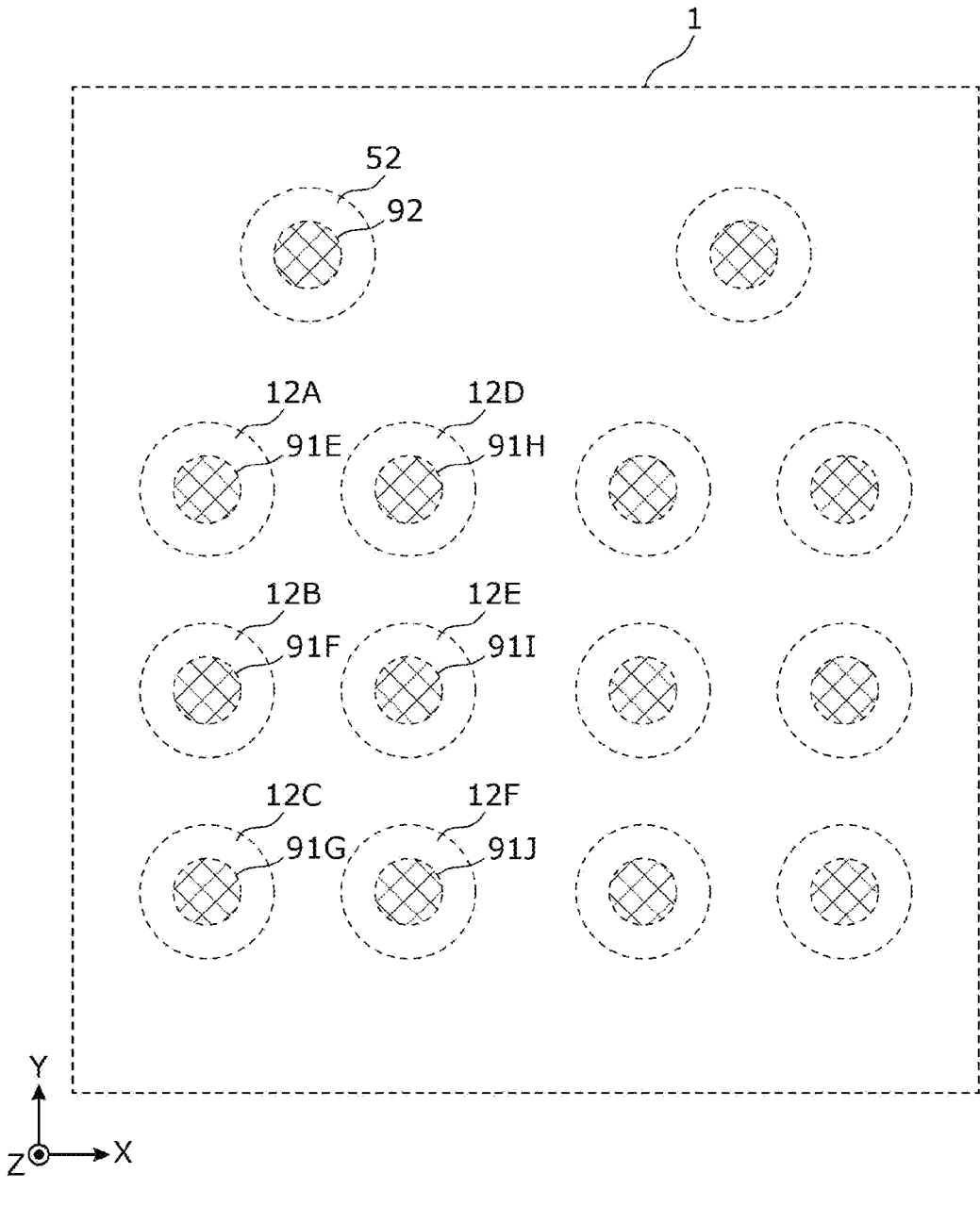
FIG. 18 is an enlarged plan view illustrating an example of a structure of the mounting substrate according to Embodiment 3.

FIG. 18 is an enlarged plan view illustrating an example of a structure of mounting substrate 70 when semiconductor device 1 includes a plurality of first wiring electrodes 12 (here, six electrodes from first wiring electrode 12A to first wiring electrode 12F).

Note that in FIG. 18, semiconductor device 1, first wiring electrodes 12 (here, first wiring electrode 12A to first wiring electrode 12F), second wiring electrode 52, first connection wirings 91 (here, first connection wiring 91E to first connection wiring 91J), and second connection wiring 92, for instance, are illustrated by broken lines as if they are visible, but actually these elements cannot be viewed from the outside of mounting substrate 70.

As illustrated in FIG. 18, when semiconductor device 1 includes a plurality of first wiring electrodes 12, one or more first connection wirings 91 are a plurality of wirings in one-to-one correspondence with the plurality of first wiring electrodes 12. In this case, the plurality of first wiring electrodes 12 are connected to first wiring 96 each by a corresponding one of first connection wirings 91 that are in one-to-one correspondence with first wiring electrodes 12.

At this time, the plurality of first connection wirings 91 may have cross sections in the same shape, the cross sections being orthogonal to a direction in which the plurality of first connection wirings 91 extend.

Accordingly, mounting substrate 70 can be relatively readily manufactured.

<Consideration>

As described in Embodiment 1, semiconductor device 1 has a structure suitable for a mounting method with which semiconductor device 1 is mounted being embedded in mounting substrate 70.

Accordingly, according to mounting substrate 70 having the above configuration, a mounting substrate for mounting semiconductor device 1 having a structure suitable for a mounting method with which semiconductor device 1 is mounted being embedded in mounting substrate 70 is provided.

Note that the same applies to the cases in which a semiconductor device mounted in mounting substrate 70 is semiconductor device 1A and is the semiconductor device to be mounted.

As described above, in the plan view of mounting substrate 70, mounting substrate 70 is in a shape having a longer direction, semiconductor device 1 is in a shape having a longer direction, and the longer direction of mounting substrate 70 and the longer direction of semiconductor device 1 are orthogonal to each other.

Accordingly, warpage of mounting substrate 70 and warpage of semiconductor device 1 that are caused during heat treatment in a process of manufacturing mounting substrate 70 can be prevented from increasing each other.

As described above, in the plan view of mounting substrate 70, electronic component 83 at least a portion of which overlaps semiconductor device 1 is in a shape having a longer direction, semiconductor device 1 is in a shape having a longer direction, and the longer direction of electronic component 83 and the longer direction of semiconductor device 1 are orthogonal to each other.

Accordingly, warpage of electronic component 83 and warpage of semiconductor device 1 that are caused during heat treatment in a process of manufacturing mounting substrate 70 can be prevented from increasing each other.

Note that in mounting substrate 70, the height from the lowest position of the upper surface of first wiring electrode 12 as a reference to the highest position of semiconductor device 1 may be greater than or equal to 15% of the length of one or more first connection wirings 91 in a direction orthogonal to mounting substrate 70.

The length of first connection wirings 91 is equivalent to the thickness of resin that fills the space directly above semiconductor device 1.

The height from the lowest position of the upper surfaces of first wiring electrodes 12 as a reference to the highest position of semiconductor device 1 is a digging amount by which the resin is dug in, and in the present disclosure, is assumed to keep 50% of the thickness of first wiring electrodes 12.

As described earlier, the thickness of first wiring electrodes 12 is greater than or equal to one third of the thickness of the resin that fills the space directly above semiconductor device 1, and thus when the digging amount is greater than or equal to ⅓×0.5 (50%)=⅙≈0.15, or stated differently, 15% of the thickness of resin, a sufficient anchor effect can be yielded.

Accordingly, while a protrusion that reflects first perimeter structure 101 is provided on the upper surface of interlayer insulating layer 78, it is possible to sufficiently provide margin of the thickness of first wiring electrodes 12 when making holes from the upper surface of interlayer insulating layer 78 to reach the upper surfaces of first wiring electrodes 12 by a laser process performed on mounting substrate 70 in a process of providing first connection wirings 91.

(Supplement)

The above has described the semiconductor device and the mounting substrate according to aspects of the present disclosure, based on Embodiment 1 to Embodiment 3, but the present disclosure is not limited to the embodiments. The scope of one or more aspects of the present disclosure may also encompass embodiments resulting from adding, to the embodiments, various modifications that may be conceived by those skilled in the art, and embodiments obtained by combining elements in different variations, as long as the resultant embodiments do not depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to a semiconductor device and a mounting substrate, for instance.

The invention claimed is:

1. A semiconductor device that is a chip-size-package type semiconductor device, the semiconductor device comprising:

a semiconductor layer;

a vertical metal-oxide semiconductor (MOS) transistor provided in the semiconductor layer;

a protective film that covers an upper surface of the vertical MOS transistor and includes:

a first opening portion through which a source electrode of the vertical MOS transistor is exposed to an outside of the protective film; and a second opening portion through which a gate electrode of the vertical MOS transistor is exposed to the outside of the protective film;

a first wiring electrode that includes copper as a principal component, thoroughly covers an exposed portion of the source electrode that is exposed to the outside of the protective film in the first opening portion, and is connected to the source electrode; and a second wiring electrode that includes copper as a principal component, thoroughly covers an exposed portion of the gate electrode that is exposed to the outside of the protective film in the second opening portion, and is connected to the gate electrode, wherein the semiconductor device is rectangular in a plan view of the semiconductor layer, an entirety of a perimeter of the first opening portion is enclosed by the protective film, an entirety of a perimeter of the second opening portion is enclosed by the protective film, a first perimeter structure is provided in a perimeter portion of the first wiring electrode in the plan view of the semiconductor layer, the first perimeter structure including the source electrode, the protective film, and the first wiring electrode that are stacked in stated order, an uppermost layer of the first perimeter structure is the first wiring electrode, a second perimeter structure is provided in a perimeter portion of the second wiring electrode in the plan view of the semiconductor layer, the second perimeter structure including the gate electrode, the protective film, and the second wiring electrode that are stacked in stated order, an uppermost layer of the second perimeter structure is the second wiring electrode, a first wiring electrode exposed portion that is an upper surface of the first wiring electrode is exposed to an outside of the semiconductor device, a second wiring electrode exposed portion that is an upper surface of the second wiring electrode is exposed to the outside of the semiconductor device, the first perimeter structure protrudes above an upper surface of an entirety of a portion of the first wiring electrode exposed portion, the portion not being included in the first perimeter structure, the second perimeter structure protrudes above an upper surface of an entirety of a portion of the second wiring electrode exposed portion, the portion not being included in the second perimeter structure, a highest position of the semiconductor device is located in at least one of the first perimeter structure or the second perimeter structure, in the plan view of the semiconductor layer, an area of the first wiring electrode exposed portion is larger than an area of the first opening portion, in the plan view of the semiconductor layer, an area of the second wiring electrode exposed portion is larger than an area of the second opening portion, the semiconductor device further comprises a metal layer provided in contact with a lower surface of the semiconductor layer, a thickness of the metal layer in a normal direction of the semiconductor layer is greater than a greatest thickness of the first wiring electrode in the normal direction of the semiconductor layer, in a cross-sectional view of the semiconductor layer, the first wiring electrode includes a wall surface in a reverse tapered shape toward an outside of the first wiring electrode, the wall surface includes an inclined surface that is inclined in the perimeter portion in the plan view of the semiconductor layer, the wall surface includes a portion not in contact with the protective film, in the first perimeter structure, the protective film includes a portion disposed between the source electrode and the first wiring electrode, along the normal direction of the semiconductor layer, and in the second perimeter structure, the protective film includes a portion disposed between the gate electrode and the second wiring electrode, along the normal direction of the semiconductor layer.

2. The semiconductor device according to claim 1, wherein in the cross-sectional view, the protective film includes a tapered region in a tapered shape toward the first opening portion in a portion in vicinity of the first opening portion in the plan view of the semiconductor layer, and in the plan view of the semiconductor layer, the wall surface is located within the tapered region.

3. The semiconductor device according to claim 1, wherein in the plan view of the semiconductor layer, the wall surface is provided along an entirety of a perimeter of the first wiring electrode.

4. The semiconductor device according to claim 1, wherein in the plan view of the semiconductor device, the semiconductor device is in a rectangular shape having a longer direction, and the wall surface is provided in a portion of a perimeter of the first wiring electrode, the portion including at least a position orthogonal to the longer direction in the plan view of the semiconductor layer.

5. The semiconductor device according to claim 1, wherein a plurality of first opening portions including the first opening portion are provided, and a plurality of first wiring electrodes including the first wiring electrode are provided in one-to-one correspondence with the plurality of first opening portions, the plurality of first wiring electrodes being identical in number to the plurality of first opening portions.

6. The semiconductor device according to claim 5, wherein in the plan view of the semiconductor layer, an area of the first wiring electrode exposed portion of each of the plurality of first wiring electrodes is larger than an area of a corresponding one of the plurality of first opening portions in one-to-one correspondence with the plurality of first wiring electrodes.

7. The semiconductor device according to claim 1, wherein when an area of the source electrode in the plan view of the semiconductor layer is denoted by M1 and an area of the first opening portion in the plan view of the semiconductor layer is denoted by S1, a first occupancy ratio expressed by S1/M1 is greater than or equal to 0.5 and less than 1.0, the first occupancy ratio being an occupancy ratio at which the area of the first opening portion in the plan view of the semiconductor layer occupies the area of the source electrode in the plan view of the semiconductor layer.

8. The semiconductor device according to claim 7, wherein the first occupancy ratio is greater than or equal to 0.9 and less than 1.0, and when an area of the first wiring electrode exposed portion in the plan view of the semiconductor layer is denoted by P1, a second occupancy ratio expressed by P1/M1 is greater than or equal to 0.9 and less than 1.1, the second occupancy ratio being an occupancy ratio at which the area of the first wiring electrode exposed portion in the plan view of the semiconductor layer occupies the area of the source electrode in the plan view of the semiconductor layer.

9. The semiconductor device according to claim 1, wherein a plurality of first opening portions including the first opening portion are provided, a plurality of first wiring electrodes including the first wiring electrode are provided in one-to-one correspondence with the plurality of first opening portions, the plurality of first wiring electrodes being identical in number to the plurality of first opening portions, and when an area of the source electrode in the plan view of the semiconductor layer is denoted by M1 and a total area of the plurality of first opening portions in the plan view of the semiconductor layer is denoted by S1, a first occupancy ratio expressed by S1/M1 is greater than or equal to 0.5 and less than 1.0, the first occupancy ratio being an occupancy ratio at which the total area of the plurality of first opening portions in the plan view of the semiconductor layer occupies the area of the source electrode in the plan view of the semiconductor layer.

10. The semiconductor device according to claim 9, wherein the first occupancy ratio is greater than or equal to 0.9 and less than 1.0, and when a total area of a plurality of first wiring electrode exposed portions of the plurality of first wiring electrodes in the plan view of the semiconductor layer is denoted by P1, the plurality of first wiring electrode exposed portions each being the first wiring electrode exposed portion, a second occupancy ratio expressed by P1/M1 is greater than or equal to 0.5 and less than 1.0, the second occupancy ratio being an occupancy ratio at which the total area of the plurality of first wiring electrode exposed portions of the plurality of first wiring electrodes in the plan view of the semiconductor layer occupies the area of the source electrode in the plan view of the semiconductor layer.

11. A mounting substrate in which a first wiring layer, an interlayer insulating layer, and a second wiring layer are stacked in stated order, the mounting substrate comprising:

the semiconductor device according to claim 1 that is mounted faceup in the interlayer insulating layer;

a first wiring provided in the second wiring layer; and one or more first connection wirings that connect the first wiring and a portion of an upper surface of the first wiring electrode and extend in a direction orthogonal to the mounting substrate, the portion not overlapping the first perimeter structure in the plan view of the semiconductor layer.

12. The mounting substrate according to claim 11, further comprising:

a second wiring provided in the second wiring layer; and a second connection wiring that connects the second wiring and a portion of an upper surface of the second wiring electrode and extends in a direction orthogonal to the mounting substrate, the portion not overlapping the second perimeter structure in the plan view of the semiconductor layer, wherein the one or more first connection wirings each have a circular cross section orthogonal to the direction in which the one or more first connection wirings extend, and the second connection wiring has a circular cross section orthogonal to the direction in which the second connection wiring extends, and the circular cross section of at least one of the one or more first connection wirings is larger than the circular cross section of the second connection wiring.

13. The mounting substrate according to claim 11, wherein the one or more first connection wirings are a plurality of first connection wirings.

14. The mounting substrate according to claim 11, wherein a height from a lowest position of the upper surface of the first wiring electrode as a reference to the highest position of the semiconductor device is greater than or equal to 15% of a length of the one or more first connection wirings in the direction orthogonal to the mounting substrate.

15. The mounting substrate according to claim 11, wherein a plurality of first wiring electrodes including the first wiring electrode are provided, the one or more first connection wirings are a plurality of first connection wirings in one-to-one correspondence with the plurality of first wiring electrodes, each of the plurality of first connection wirings is connected to the first wiring by a corresponding one of the plurality of first wiring electrodes in one-to-one correspondence with the plurality of first connection wirings, and the plurality of first connection wirings have cross sections in a same shape, the cross sections being orthogonal to a direction in which the plurality of first connection wirings extend.

16. The mounting substrate according to claim 11, wherein in a plan view of the mounting substrate, the mounting substrate is in a shape having a longer direction, the semiconductor device is in a shape having a longer direction, and the longer direction of the mounting substrate and the longer direction of the semiconductor device are orthogonal to each other.

17. The mounting substrate according to claim 11, further comprising:

an electronic component disposed above the interlayer insulating layer, wherein in a plan view of the mounting substrate, the electronic component is in a shape having a longer direction, the semiconductor device is in a shape having a longer direction, at least a portion of the electronic component overlaps the semiconductor device, and the longer direction of the electronic component and the longer direction of the semiconductor device are orthogonal to each other.

18. The semiconductor device according to claim 1, wherein the inclined surface of the wall surface extends from an outermost perimeter edge of the first wiring electrode to a portion that the wall surface contacts the protective film.

* * * * *